(12) United States Patent
Miyake

(10) Patent No.: US 10,007,161 B2
(45) Date of Patent: Jun. 26, 2018

(54) DISPLAY DEVICE

(71) Applicant: Semiconductor Energy Laboratory Co., Ltd., Atsugi-shi, Kanagawa-ken (JP)

(72) Inventor: Hiroyuki Miyake, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 15/298,296

(22) Filed: Oct. 20, 2016

(65) Prior Publication Data

US 2017/0115515 A1   Apr. 27, 2017

(30) Foreign Application Priority Data

Oct. 26, 2015 (JP) ................. 2015-210120

(51) Int. Cl.
  *G02F 1/137*    (2006.01)
  *G02F 1/1368*   (2006.01)
  (Continued)

(52) U.S. Cl.
  CPC ............ *G02F 1/137* (2013.01); *G02F 1/1368* (2013.01); *G02F 1/13338* (2013.01);
  (Continued)

(58) Field of Classification Search
  CPC ............ H01L 27/3262; H01L 27/1255; H01L 27/3276; H01L 27/3244; H01L 27/0688;
  (Continued)

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1737044 A   12/2006
EP   2226847 A    9/2010
(Continued)

OTHER PUBLICATIONS

Khan.A et al., "Flexible eWriter Technology and Applications", SID Digest '15 : SID International Symposium Digest of Technical Papers, Jun. 2, 2015, pp. 242-245.
(Continued)

*Primary Examiner* — Thoi Duong
(74) *Attorney, Agent, or Firm* — Robinson Intellectual Property Law Office; Eric J. Robinson

(57) ABSTRACT

Provided is a novel display device which includes a cholesteric liquid crystal and in which a rewritable region and a region capable of retaining display content can coexist. The connection of a capacitor to a liquid crystal element including a cholesteric liquid crystal can be externally controlled, so that display can be maintained or changed. The connection of the capacitor to the liquid crystal element can be controlled using a transistor as a switching element. When a transistor including an oxide semiconductor is used as the transistor, leakage can be reduced and the voltage of the capacitor can be favorably retained.

12 Claims, 28 Drawing Sheets

(51) Int. Cl.

| | |
|---|---|
| *G06F 3/0354* | (2013.01) |
| *G02F 1/133* | (2006.01) |
| *G02F 1/1333* | (2006.01) |
| *G02F 1/1335* | (2006.01) |
| *G02F 1/1337* | (2006.01) |
| *G02F 1/1339* | (2006.01) |
| *G02F 1/1343* | (2006.01) |
| *G02F 1/1362* | (2006.01) |
| *H01L 29/786* | (2006.01) |

(52) U.S. Cl.
CPC ...... *G02F 1/13718* (2013.01); *G06F 3/03545* (2013.01); *G02F 1/1337* (2013.01); *G02F 1/13306* (2013.01); *G02F 1/13394* (2013.01); *G02F 1/13624* (2013.01); *G02F 1/133305* (2013.01); *G02F 1/133345* (2013.01); *G02F 1/133528* (2013.01); *G02F 1/134336* (2013.01); *G02F 1/136286* (2013.01); *G02F 2001/13398* (2013.01); *G02F 2001/133742* (2013.01); *H01L 29/7869* (2013.01)

(58) Field of Classification Search
CPC ............. H01L 27/3248; H01L 27/3265; H01L 27/1214; H01L 27/307; H01L 29/786; H01L 29/78669; H01L 29/78678; H01L 21/8221; H01L 21/823431; H01L 21/845; H01L 23/528; H01L 23/5386; H01L 28/40; G09G 3/3677; G09G 3/3648; G09G 3/3225; G09G 2300/0426; G09G 2300/0809; G09G 2300/08; G09G 2300/04; G09G 5/003; G11C 11/1653; G11C 11/1675; G11C 11/565; G11C 11/1673; G11C 11/24; G11C 11/34; G11C 11/405; G11C 13/0023; G11C 13/0038; G11C 13/004; G11C 15/043; G11C 16/26; G11C 5/025; G11C 5/06; G11C 5/148; G02F 1/1343; G02F 1/136; G02F 1/1368; G02F 1/136286; G02F 1/134309; G02F 1/13306; G02F 1/136213; G02F 1/13624; G02F 1/133; G02F 1/134336; G02F 1/1345; G02F 1/13452; G02F 1/1362; G06F 3/044
USPC ....................................... 349/38, 43, 48, 139
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0057895 A1 | 3/2003 | Kimura |
| 2003/0189401 A1 | 10/2003 | Kido et al. |
| 2003/0218222 A1 | 11/2003 | Wager, III et al. |
| 2003/0222589 A1 | 12/2003 | Osame et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0135323 A1* | 5/2009 | Yang .................. G02F 1/13624 349/37 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0279356 A1 | 11/2011 | Takemura |
| 2011/0279419 A1 | 11/2011 | Takemura |

(56) References Cited

U.S. PATENT DOCUMENTS

| | | |
|---|---|---|
| 2012/0037972 A1 | 2/2012 | Yoneda |
| 2013/0241965 A1 | 9/2013 | Koyama |
| 2013/0272055 A1 | 10/2013 | Yamamoto |
| 2015/0023114 A1 | 1/2015 | Kurokawa |
| 2015/0060896 A1 | 3/2015 | Okano et al. |
| 2015/0162359 A1 | 6/2015 | Kaneyasu |
| 2015/0325172 A1 | 11/2015 | Koyama |
| 2016/0155480 A1 | 6/2016 | Inoue et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-195910 A | 9/2013 |
| WO | WO-2004/114391 | 12/2004 |

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. '165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID DIGEST '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFe2O4, and YB2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperaturs Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2; Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

100

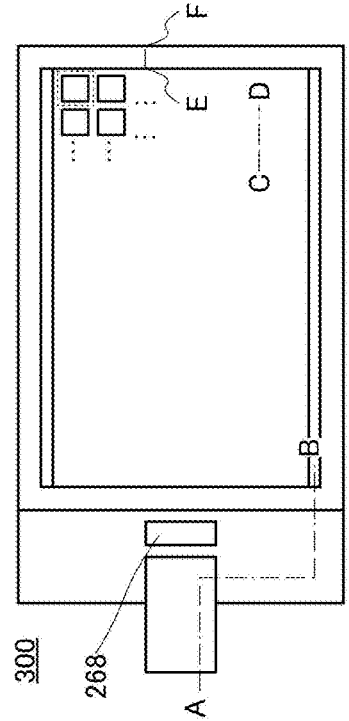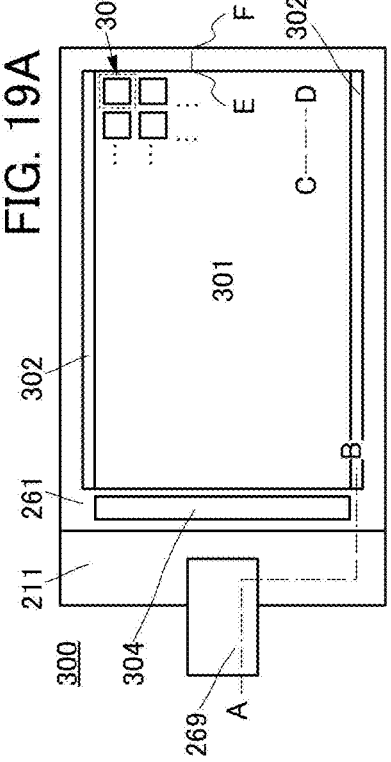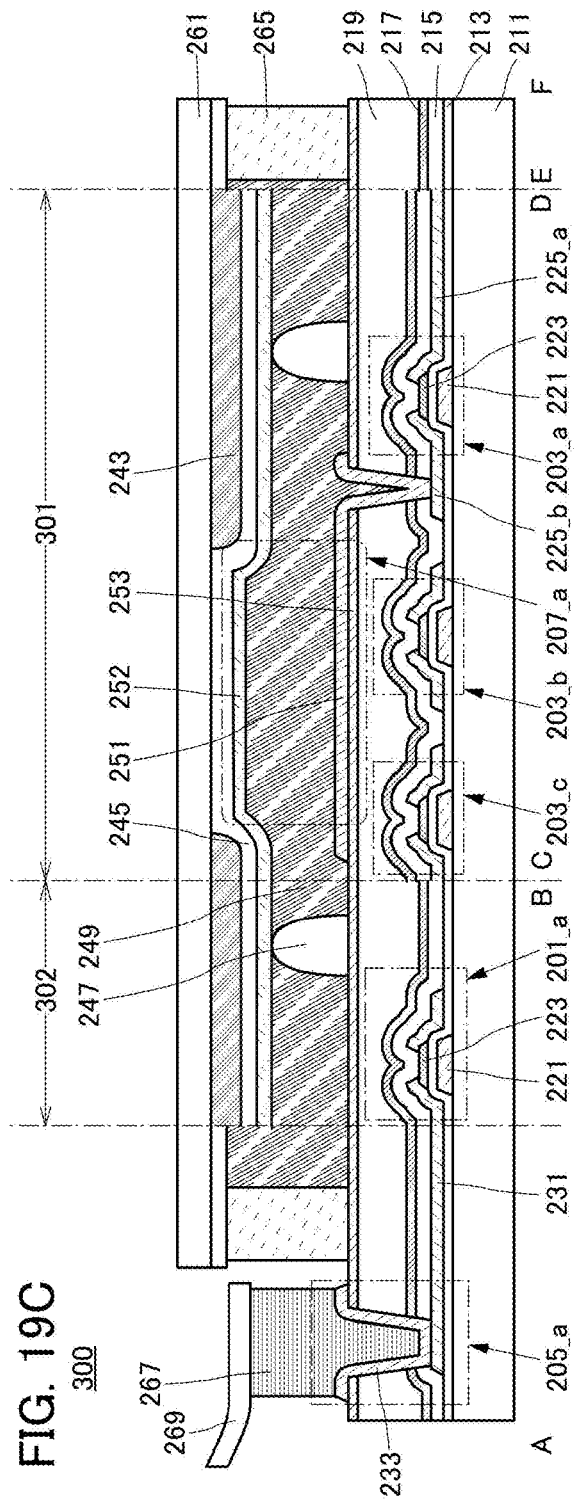

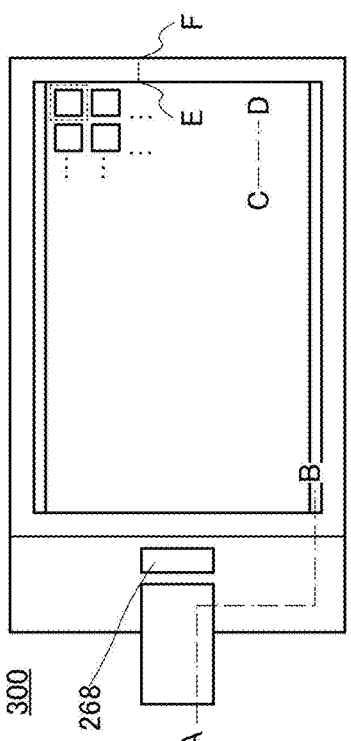
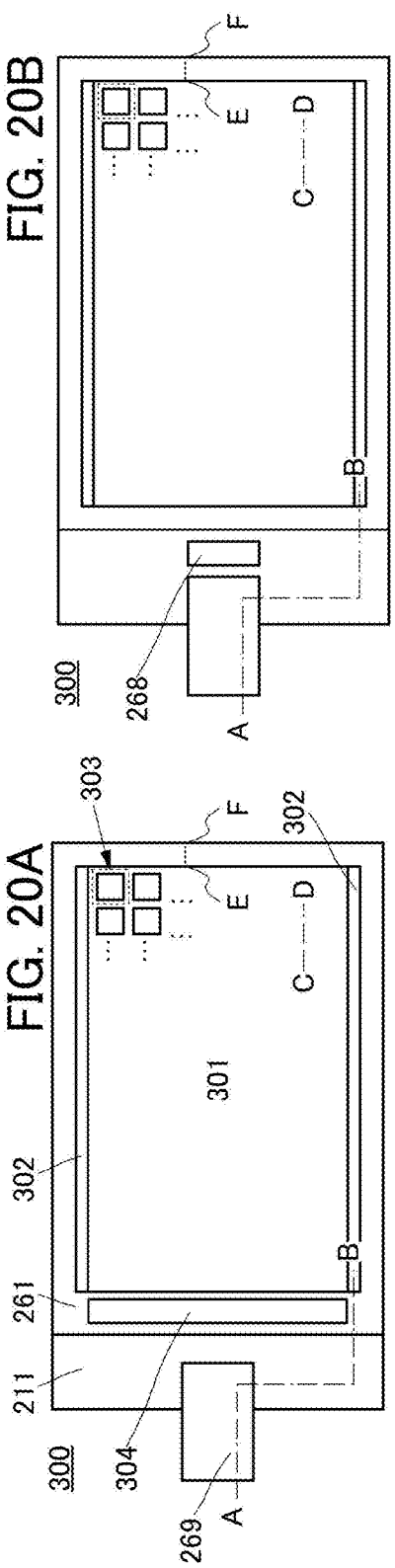
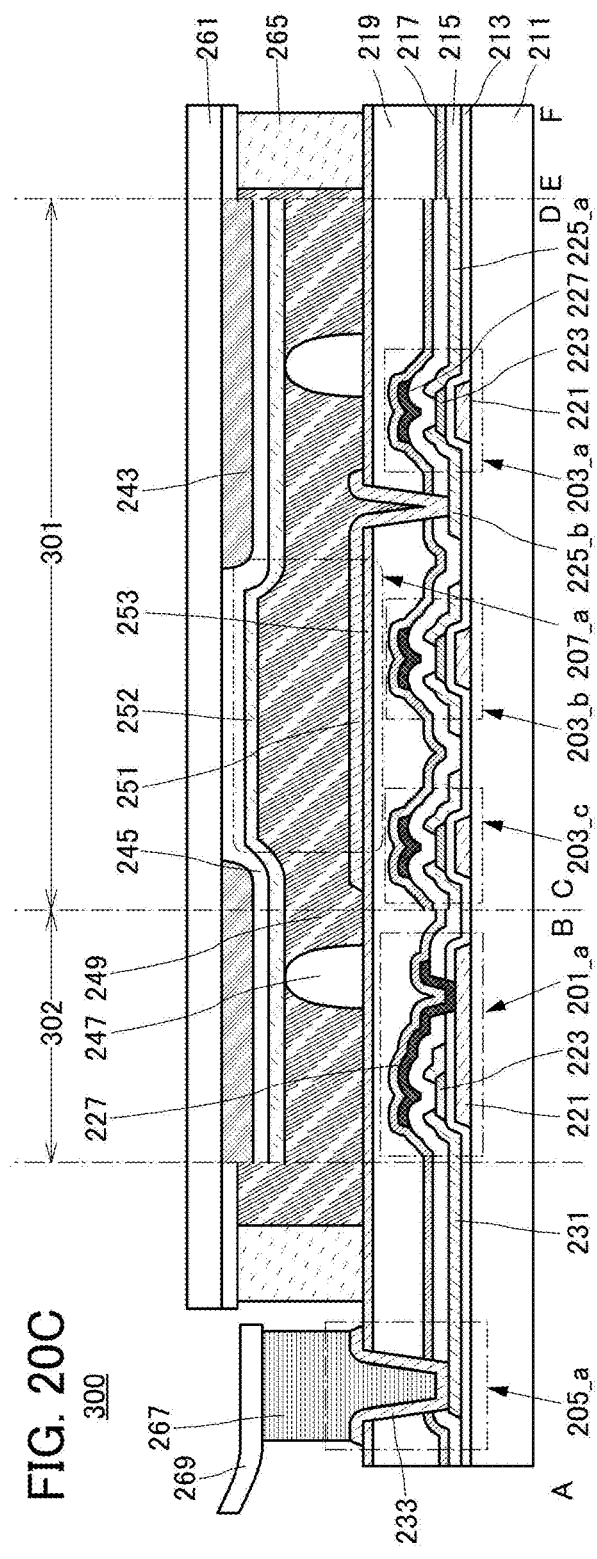

FIG. 21A  out-of-plane method CAAC-OS
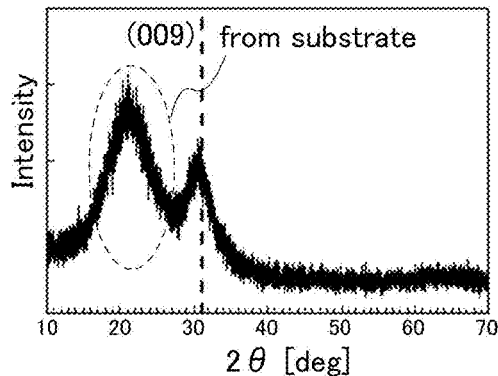
FIG. 21B  in-plane method φ scan CAAC-OS
FIG. 21C  in-plane method φ scan single crystal OS
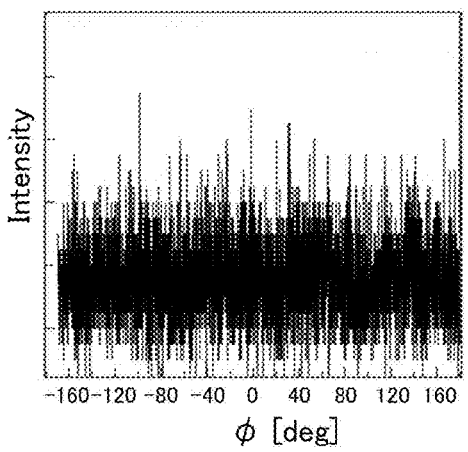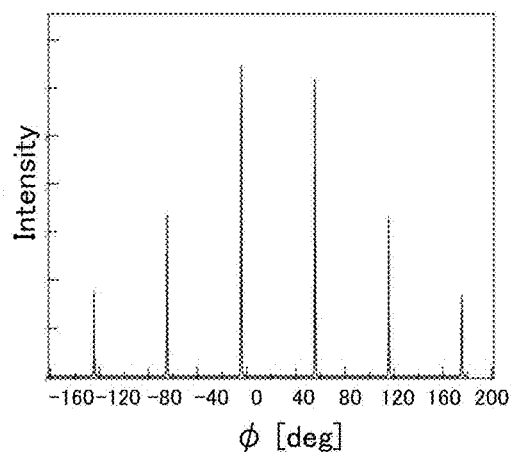
FIG. 21D
FIG. 21E
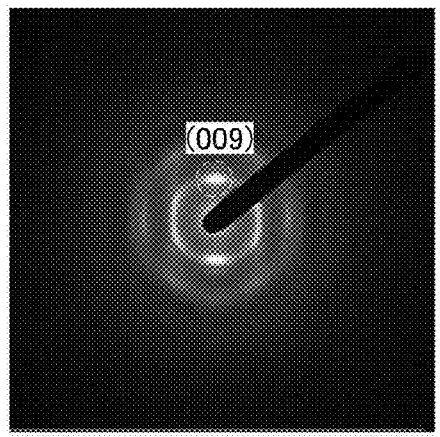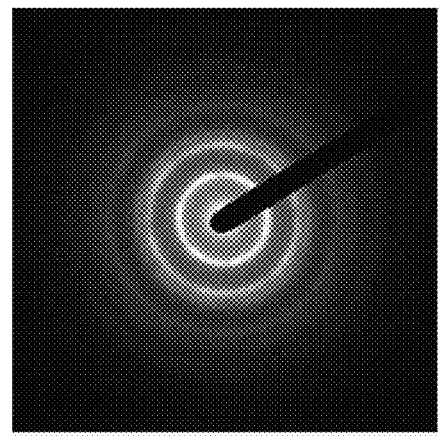

800

DISPLAY DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. In some cases, a display device, an electro-optical device, a semiconductor circuit, or an electronic device includes a semiconductor device.

2. Description of the Related Art

There is a display device including a cholesteric liquid crystal whose transmittance changes with the pressure of a pen. The display device is used as a notebook.

REFERENCES

Patent Document

[Patent Document 1] Japanese Published Patent Application No. 2013-195910

Non-Patent Document

[Non-Patent Document 1] A. KHAN and E. MONTBACH, "Flexible eWriter Technology and Applications", SID DIGEST '15: SID INTERNATIONAL SYMPOSIUM DIGEST OF TECHNICAL PAPERS, Jun. 2, 2015, pp. 242-245

SUMMARY OF THE INVENTION

In a conventional display device, no distinction is made between a writable region and a non-writable region. For this reason, even when data needs to be written only in, for example, an answer section of a questionnaire or a test answer sheet and not in the other region, the entire display area needs to be refreshed to update written data, leading to an increase of power consumption.

In the above example of a questionnaire or a test answer sheet, it is difficult for the conventional display to keep displaying data that should not be erased by a user, such as a question, a border line, or a ruled line.

An object of one embodiment of the present invention is to provide a novel display device or to provide a novel semiconductor device in view of the above-described background.

Note that the descriptions of a plurality of objects do not preclude the existence of each object. One embodiment of the present invention does not necessarily achieve all the objects listed above. Objects other than those listed above are apparent from the description of the specification, drawings, claims, and the like, and such objects could be objects of one embodiment of the present invention.

One embodiment of the present invention is a display device which includes first to third transistors, first and second capacitors, a liquid crystal element, and first to fourth wirings. A first terminal of the first transistor is electrically connected to the first wiring. A second terminal of the first transistor is electrically connected to a first terminal of the third transistor. A gate of the first transistor is electrically connected to the second wiring. A first terminal of the second transistor is electrically connected to the third wiring. A second terminal of the second transistor is electrically connected to a gate of the third transistor. A gate of the second transistor is electrically connected to the fourth wiring. The first terminal of the third transistor is electrically connected to the second terminal of the first transistor. A first terminal of the liquid crystal element is electrically connected to the second terminal of the first transistor. A first voltage is applied to a second terminal of the liquid crystal element. A first terminal of the first capacitor is electrically connected to a second terminal of the third transistor. A second voltage is applied to a second terminal of the first capacitor. A first terminal of the second capacitor is electrically connected to the second terminal of the second transistor. The second voltage is applied to a second terminal of the second capacitor.

One embodiment of the present invention is a display device including a cholesteric liquid crystal. The display device includes an input unit. The display device includes a first display mode and a second display mode. The first display mode includes a first display region and a second display region in a display region. The first display region is capable of displaying a first display state and a second display state for displaying data input by the input unit in addition to the first display state. The second display region is configured to display only the first display state. The second display mode is capable of displaying the data input by the input unit in addition to the first display state in the entire display region.

One embodiment of the present invention is a display device including, as a pixel, a liquid crystal element capable of changing the orientation of a cholesteric liquid crystal by application of an electric field to the cholesteric liquid crystal. The display device is configured to display data by application of stress to a portion with a stylus pen to change the orientation in the portion from a focal conic state to a planar state and to change the reflectance of the cholesteric liquid crystal. The display device includes both a region capable of changing into the planar state under the stress and a region capable of maintaining the focal conic state even under the stress by application of the electric field.

One embodiment of the present invention can provide a novel display device or a novel semiconductor device.

BRIEF DESCRIPTION OF THE DRAWINGS

FIGS. 19A to 19C are top views and a cross-sectional view illustrating one embodiment of the present invention.

FIGS. 20A to 20C are top views and a cross-sectional view illustrating one embodiment of the present invention.

FIGS. 21A to 21E show structural analysis of a CAAC-OS and a single crystal oxide semiconductor by XRD and selected-area electron diffraction patterns of a CAAC-OS.

DETAILED DESCRIPTION OF THE INVENTION

Figure 1:
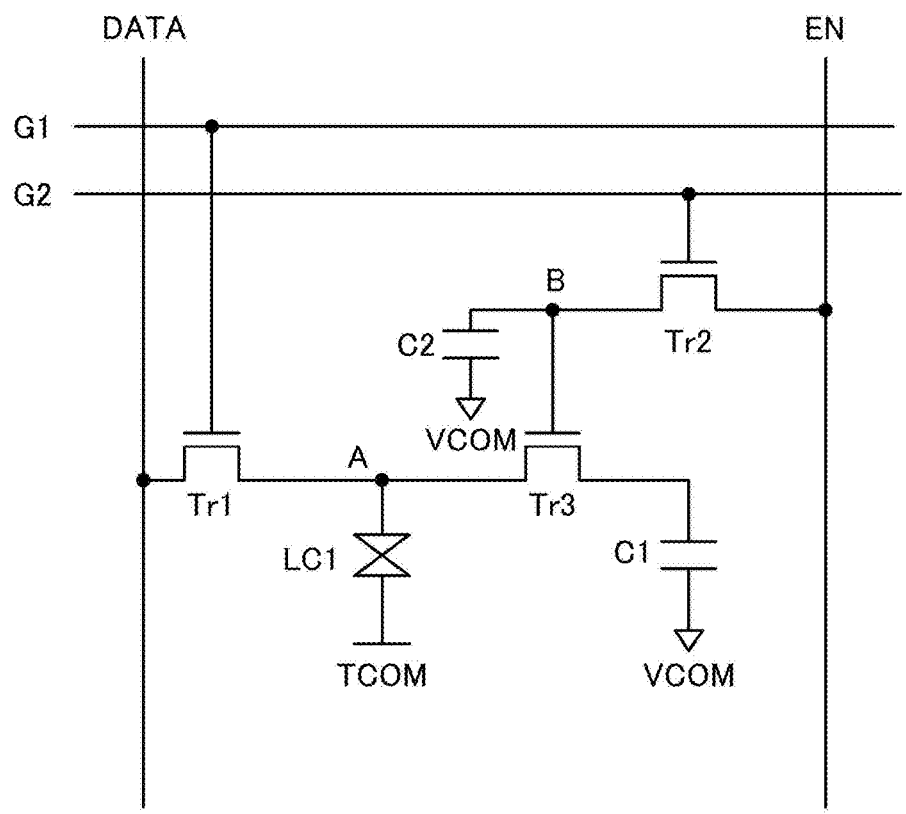
FIG. 1 illustrates a configuration of a pixel.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

Furthermore, in this specification, any of the embodiments and the examples below can be combined as appropriate. In the case where some structural examples are given in one embodiment or example, any of the structural examples can be combined as appropriate.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

Unless otherwise specified, an on-state current in this specification refers to a drain current of a transistor in the on state. Unless otherwise specified, the on state of an n-channel transistor means that the voltage difference between its gate and source ($V_{GS}$) is higher than or equal to the threshold voltage ($V_{th}$) of the transistor, and the on state of a p-channel transistor means that $V_{GS}$ is lower than or equal to $V_{th}$. For example, the on-state current of an n-channel transistor sometimes refers to a drain current that flows when $V_{GS}$ is higher than or equal to $V_{th}$. The on-state current of a transistor depends on voltage between its drain and source ($V_{DS}$) in some cases.

Unless otherwise specified, the off-state current in this specification refers to a drain current of a transistor in the off state. Unless otherwise specified, the off state of an n-channel transistor means that $V_{GS}$ is lower than $V_{th}$, and the off state of a p-channel transistor means that $V_{GS}$ is higher than $V_{th}$. For example, the off-state current of an n-channel transistor sometimes refers to a drain current that flows when $V_{GS}$ is lower than $V_{th}$. The off-state current of a transistor depends on $V_{GS}$ in some cases. Thus, "the off-state current of a transistor is lower than $10^{-21}$ A" may mean there is $V_{GS}$ at which the off-state current of the transistor is lower than $10^{-21}$ A.

The off-state current of a transistor depends on $V_{DS}$ in some cases. Unless otherwise specified, the off-state current in this specification may be an off-state current at $V_{DS}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{DS}$ at which the required reliability of a semiconductor device or the like including the transistor is ensured or $V_{DS}$ used in the semiconductor device or the like.

In this specification, a high power supply voltage is referred to as an H level (or $V_{DD}$), and a low power supply voltage is referred to as an L level (or GND), in some cases.

Embodiment 1

In this embodiment, a configuration example of a display device which is one embodiment of the present invention will be described.

<Configuration Example 1 of Pixel>

The display device includes a plurality of pixels. FIG. 1 illustrates a typical configuration example of a pixel 100 included in the display device. The pixel 100 illustrated in FIG. 1 includes a transistor Tr1, a transistor Tr2, a transistor Tr3, a liquid crystal element LC1, a capacitor C1, and a capacitor C2.

The pixel 100 is electrically connected to a wiring DATA, a wiring EN, a wiring G1, and a wiring G2.

A first terminal of the transistor Tr1 is electrically connected to the wiring DATA. A second terminal of the transistor Tr1 is electrically connected to a first terminal of the transistor Tr3. A gate of the transistor Tr1 is electrically connected to the wiring G1. A first terminal of the transistor Tr2 is electrically connected to the wiring EN. A second terminal of the transistor Tr2 is electrically connected to a gate of the transistor Tr3. A gate of the transistor Tr2 is electrically connected to the wiring G2. The first terminal of the transistor Tr3 is electrically connected to the second terminal of the transistor Tr1. A first terminal of the liquid crystal element LC1 is electrically connected to the second terminal of the transistor Tr1. A second terminal of the liquid crystal element LC1 is supplied with a voltage TCOM. A first terminal of the capacitor C1 is electrically connected to a second terminal of the transistor Tr3. A second terminal of the capacitor C1 is supplied with a voltage VCOM. A first terminal of the capacitor C2 is electrically connected to the second terminal of the transistor Tr2. A second terminal of the capacitor C2 is supplied with the voltage VCOM.

The liquid crystal element LC1 includes, in its category, an element whose transmittance is controlled by a voltage. The liquid crystal element includes at least a pair of electrodes and a liquid crystal layer between the pair of electrodes. The transmittance of the liquid crystal layer changes with a change in orientation of liquid crystal molecules included in the liquid crystal layer which depends on the intensity of an electric field formed between the pair of electrodes. There are a transmissive type and a reflective type according to the direction of light extraction through the liquid crystal layer.

One of the pair of electrodes of the liquid crystal element LC1 functions as a pixel electrode, and the other functions as a counter electrode.

The wiring DATA has a function of supplying an image signal to the liquid crystal element LC1.

FIG. 1 illustrates an example in which the transistors are n-channel transistors. When a high potential is supplied to the wiring G1, an image signal is supplied to the liquid crystal element from the wiring DATA through the transistor Tr1. The transmittance of the liquid crystal element depends on the potential of the image signal.

<Liquid Crystal Element>

Figure 6A:
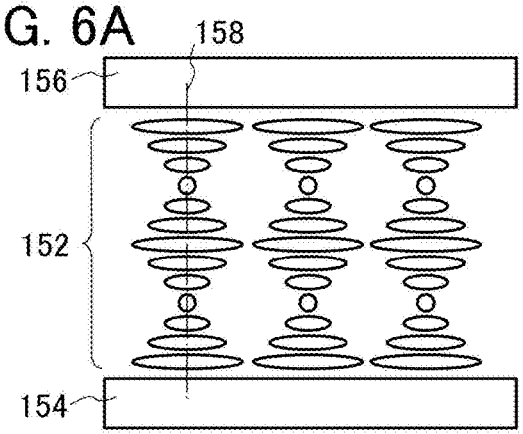
FIGS. 6A to 6D illustrate schematic views of a cholesteric liquid crystal and electro-optical characteristics of a liquid crystal element of one embodiment of the present invention.
Figure 6B:
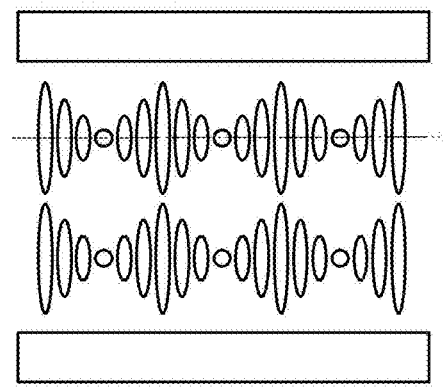
Figure 6C:
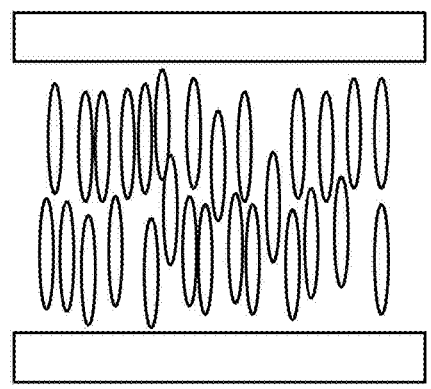

In this embodiment, a display device including a cholesteric liquid crystal element is described as one example. FIGS. 6A to 6C are schematic diagrams illustrating the orientation of a cholesteric liquid crystal. FIGS. 6A to 6C are schematic cross-sectional views in which a cholesteric liquid crystal 152 is provided between substrates 154 and 156. The cholesteric liquid crystal 152 has a helical structure in which rod-shaped liquid crystal molecules are oriented with a gradual twist in the same direction around a helical axis 158 (indicated by dashed-dotted line) as illustrated in FIG. 6A.

Depending on the helical structure and the orientation of the molecules, the cholesteric liquid crystal has three states: a planar state (FIG. 6A); a focal conic state (FIG. 6B); and a homeotropic state (FIG. 6C) in which all liquid crystal molecules are oriented perpendicular or substantially perpendicular to the substrates.

Figure 6D:
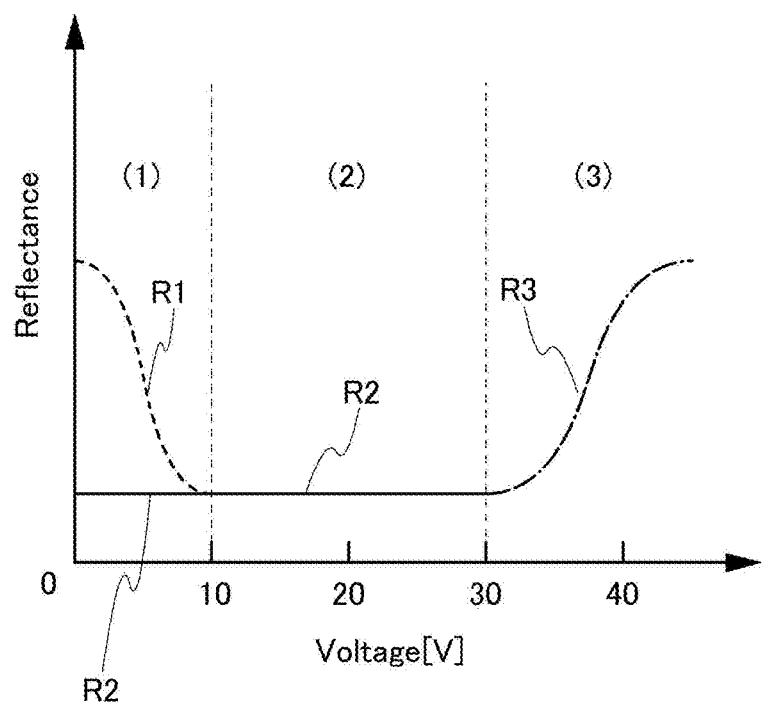

FIG. 6D schematically illustrates reflectance characteristics as a function of voltage applied to the cholesteric liquid crystal element. As the applied voltage increases, the planar state changes to the focal conic state. This corresponds to a shift from a range (1) to a range (2) in FIG. 6D. Dashed line R1 indicates the reflectance of the liquid crystal element in the planar state, and line R2 indicates the reflectance of the liquid crystal element in the focal conic state. In the planar state, light scattering easily occurs, leading to a high reflectance.

The orientation of the liquid crystal changes so that the helical axis 158 becomes parallel to the electrodes in the focal conic state; accordingly, light is easily transmitted through the liquid crystal layer. For example, when one of the substrates has a light-transmitting property and a black layer is provided outside the liquid crystal element, light transmitted through the liquid crystal layer in the focal conic state is absorbed by the black layer, whereby black is displayed. The focal conic state is stable, and even when the voltage is set to 0 V, the focal conic state is maintained without returning to the planar state. That is, the liquid crystal shows characteristics indicated by not dashed line R1 but line R2.

With a further increase in voltage, the focal conic state changes to the homeotropic state (dashed-dotted line R3) in a range (3). The state returns to the focal conic state as described above when the voltage is decreased gradually, whereas the state changes to the planar state (FIG. 6A) when the voltage is decreased rapidly.

As described above, the cholesteric liquid crystal has two stable states, i.e., the focal conic state and the planar state, which can be switched by changing the way of applying the voltage.

Note that FIG. 6D schematically illustrates typical characteristics of the cholesteric liquid crystal, and one embodiment of the present invention is not limited to the illustrated characteristics. When a liquid crystal material exhibiting another cholesteric phase is used, the reflectance as a function of voltage is different and operation at a lower voltage is possible.

The change to the planar orientation can be achieved not only by voltage control but also by stress application to the liquid crystal layer from the outside with a voltage of 0 V applied between the electrodes after formation of the focal conic state.

Figure 7A:
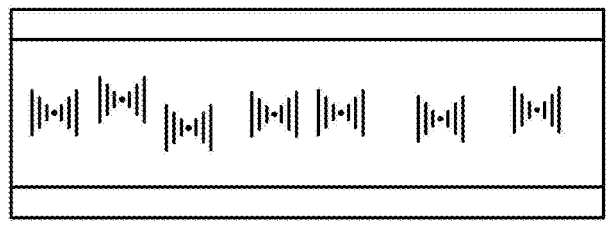
FIGS. 7A to 7C schematically illustrate a cholesteric liquid crystal and a display device.
Figure 7B:
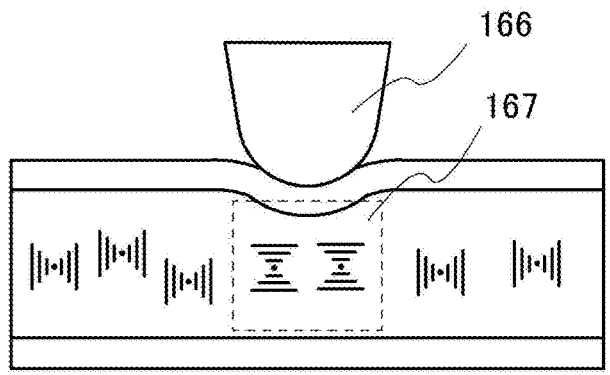
Figure 7C:
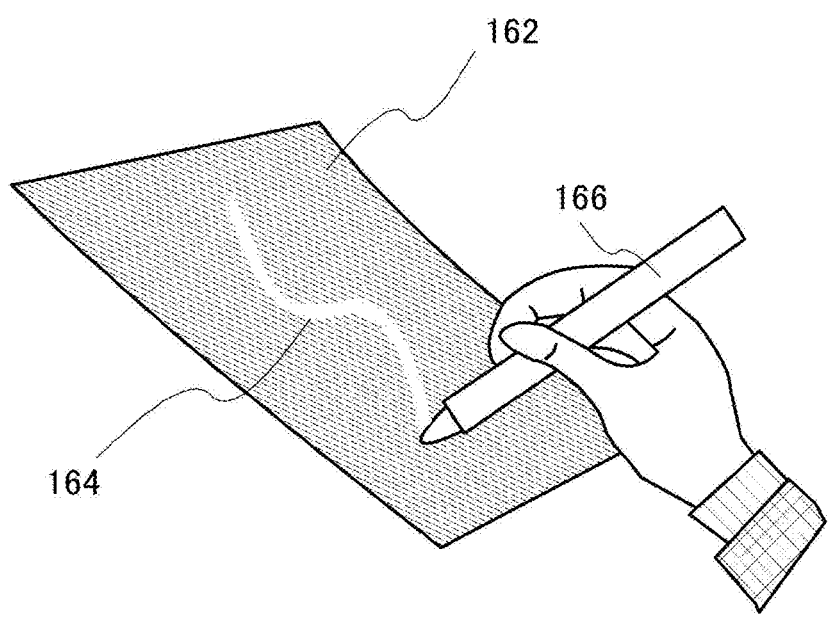

For example, a display device 162 is formed using a substrate of a material that is easily bendable under stress, such as a plastic film, which is provided with an electrode, and the state is changed to the focal conic state by voltage application (FIG. 7A) and the voltage is then set to 0 V. With the stroke of a stylus pen 166 on a surface of the substrate, a portion of the substrate which is in contact with the stylus pen 166 is bent and stress is thus applied to the liquid crystal layer; accordingly, only that region changes into a region 167 in the planar state (FIG. 7B). Owing to the difference in light reflection property between the planar state and the focal conic state, only a portion stroked with the stylus pen 166 (a planar-state portion 164) looks as if a character is written or a line is drawn (FIG. 7C).

After the change to the planar state, the planar state is maintained. The display state can be changed to the focal conic state by voltage application. Alternatively, a voltage at which the focal conic state is generated may be initially applied, in which case the focal conic state is maintained and does not change to the planar state even when stress is applied to the liquid crystal layer.

Therefore, display based on the content input with the pen can be maintained by generating the planar state without applying a voltage, whereas the content input with the pen can be prevented from being displayed by retaining the voltage of the liquid crystal element in advance so that the focal conic state can be maintained.

The voltage of the liquid crystal element can be maintained by connecting a capacitor to the liquid crystal element. Whether display is maintained or changed can be selected when the connection of the capacitor to the liquid crystal element can be externally controlled.

For example, the above-described liquid crystal element or the like may be configured to change to the planar state when not connected to a capacitor, and to maintain the focal conic state when connected to a capacitor to maintain the voltage of the liquid crystal element.

Specifically, the circuit illustrated in FIG. 1 enables the above-described control.

<Operation Example of Pixel and Timing Chart>

Figure 2:
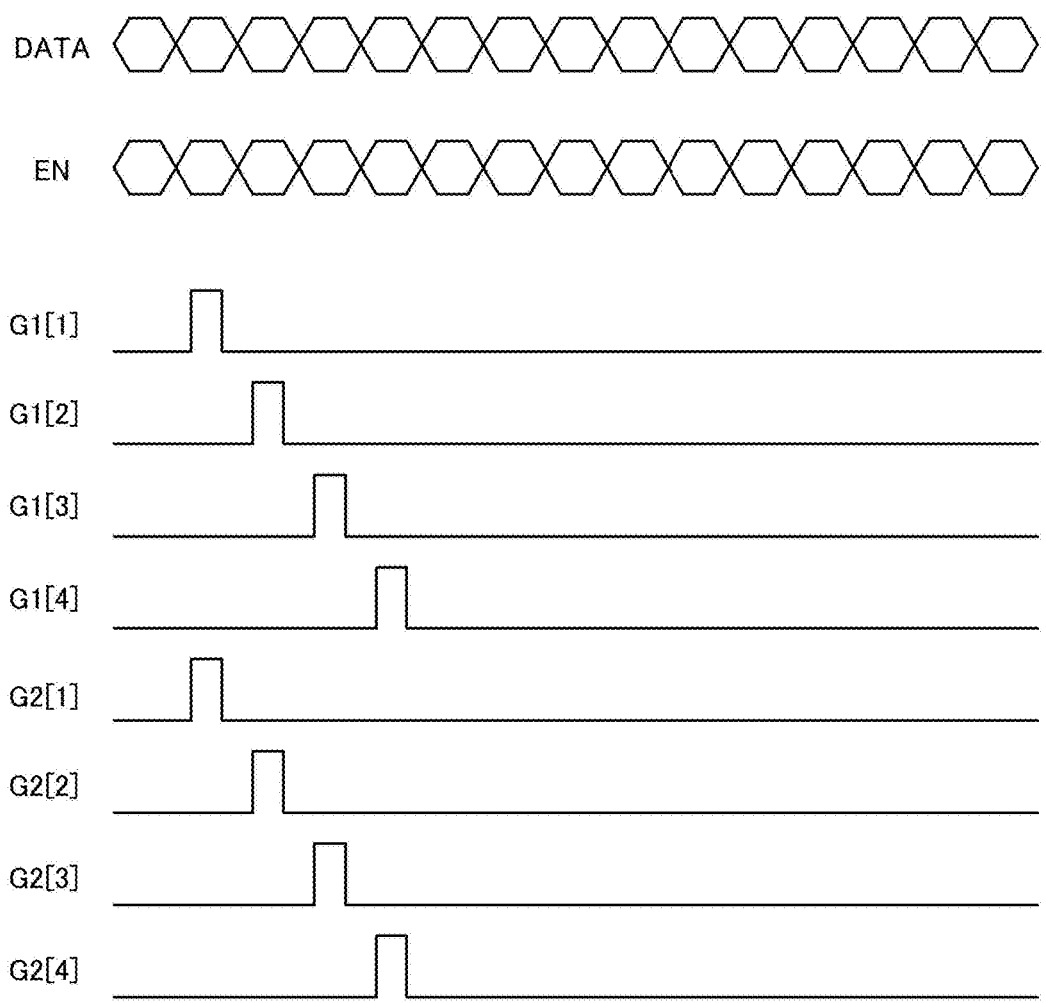
FIG. 2 is a timing chart illustrating an operation of a pixel.
Figure 3:
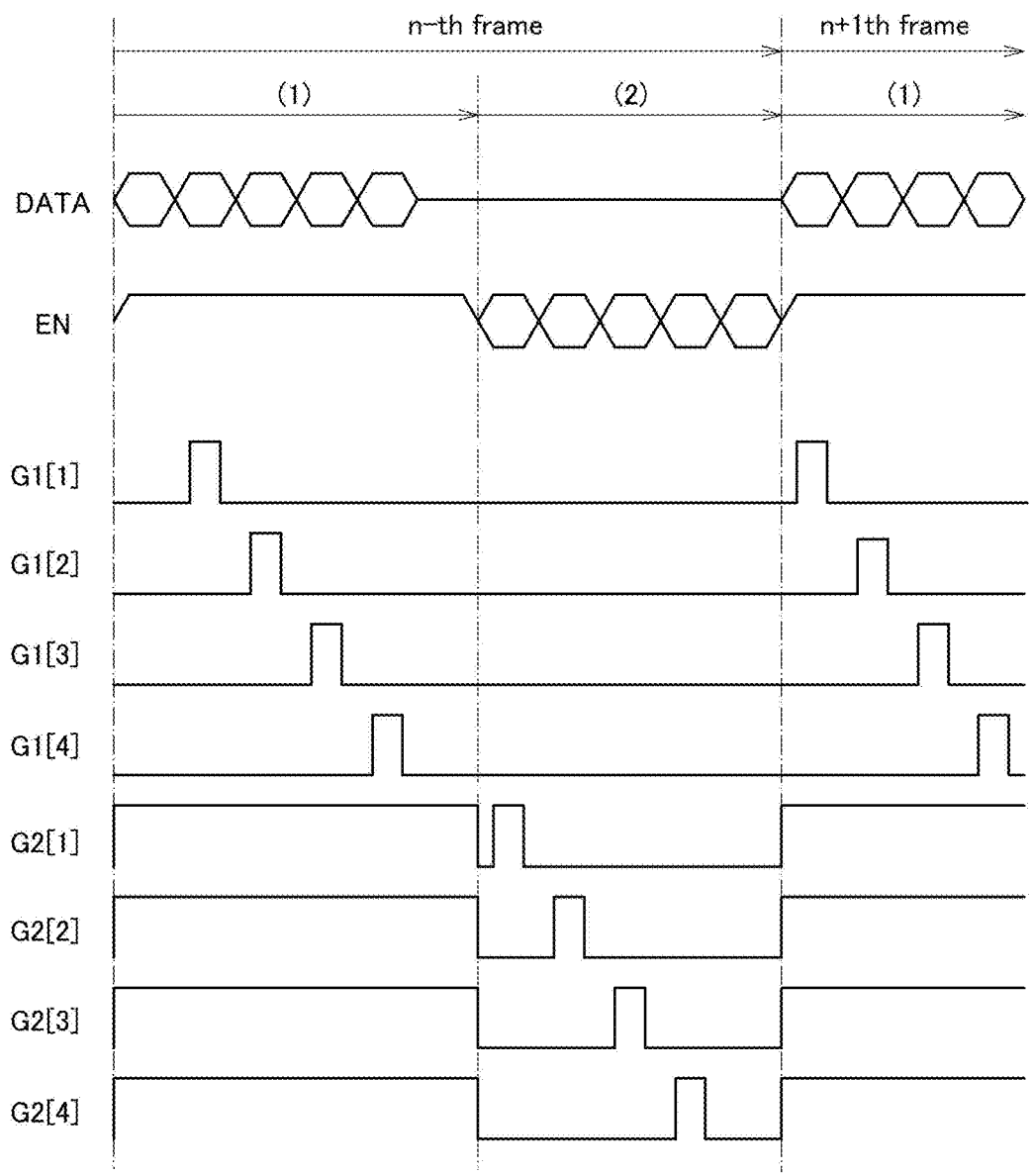
FIG. 3 is a timing chart illustrating an operation of a pixel.

An operation example of the pixel 100 in FIG. 1 will be described below with reference to timing charts in FIGS. 2 and 3. FIGS. 2 and 3 are timing charts for four pixels arranged next to one another in the data line direction in a given column of a pixel portion where a plurality of pixels in FIG. 1 are arranged in a matrix, and illustrate a potential supplied to the wiring DATA, a potential supplied to the wiring EN, and potentials supplied to wirings G1[1] to G1[4] and wirings G2[1] to G2[4]. The method described in this embodiment can also be employed in the case where the number of pixels is n (n is an integer of 5 or more).

In FIG. 1, a node of the second terminal of the transistor Tr1, the first terminal of the liquid crystal element, and the first terminal of the transistor Tr3 is denoted by a node A, and a node of the second terminal of the transistor Tr2 and the gate of the transistor Tr3 is denoted by a node B.

A scan signal is applied to the wiring G1 to control the electrical conduction of the transistor Tr1; data transmitted through the wiring DATA is written to the node A; and display is performed in accordance with the data.

The wiring EN is either high or low. When the wiring EN is high, the transistor Tr3 is constantly on; therefore, the same potential as that of the node A is also accumulated in the capacitor C1.

When the wiring EN is low, the transistor Tr3 is off. It is desirable that the capacitance of the capacitor C1 be significantly larger than the capacitance CLC of the liquid crystal element LC1. That is, the capacitance of the node A satisfies Cp>>CLC when the node B is high with respect to the capacitance CLC and the other capacitance Cp, and satisfies Cp<CLC when the node B is low.

Consequently, the change in liquid crystal of the pixel by input with the pen is maintained when the node B is low. When the node B is high, the potential of the liquid crystal element is retained even when the liquid crystal of the pixel is changed by input with the pen because Cp is large; thus, display returns to the original display.

In a pixel in a region where a change from the focal conic state to the planar state is desirably prevented to fix the display content, the wiring EN is set high as described above. Accordingly, the transistor Tr3 is turned on, and the potential of the liquid crystal element is retained owing to a potential formed by charge of the capacitor C1. Therefore, the change from the focal conic state to the planar state does not occur.

In the case of the pixel portion in which the plurality of pixels illustrated in FIG. 1 are arranged, the following method can be employed: the wiring G1 in a given pixel of the pixel portion is set high to select the pixel and apply a potential of the data line to the pixel; the wiring G2 is also set high at the same time to control a potential applied to the wiring EN and determine whether to make the pixel rewritable or non-rewritable; and this operation is sequentially performed on the adjacent pixels. The timing chart in FIG. 2 illustrates this method.

Furthermore, another method may be employed, in which a period for writing image data to the entire pixel portion and a period for determining whether to make the pixels in the entire pixel portion rewritable or non-rewritable are separately provided. The timing chart in FIG. 3 illustrates this method, and illustrates an operation example in which a period (1) for writing image data and a period (2) for determining whether to make the pixels rewritable or non-rewritable are alternately repeated.

In the method illustrated in FIG. 3, both the wiring EN and the wiring G2 are kept high in the period (1) of an n-th frame (n is a natural number), so that the transistor Tr3 is turned on and a potential based on image data of the data line is also applied to the liquid crystal element LC1 and the capacitor C1.

After the writing to the entire pixel portion is completed in the period (1) of the n-th frame, the wirings G2[1] to G2[4] are set low first and then sequentially set high in the period (2) of the n-th frame, so that the transistors Tr2 in the pixels are sequentially turned on and the potential of the wiring EN is applied to the nodes B. Thus, whether to make the pixels writable or non-writable is determined. After that, in each of (n+1)-th and subsequent frames, writing to the pixel portion is similarly performed in the period (1), and whether to make the pixels writable or non-writable is determined in the period (2).

For the method in FIG. 2, the wiring G1 and the wiring G2 may be electrically connected to each other to apply the same potential, or may be a single wiring for applying a potential to the gates of the transistors Tr1 and Tr2. For the method in FIG. 3, the wiring G1 and the wiring G2 should be separately provided.

When the wirings G1 and G2 are separately provided, a portion where pen-input data can be displayed and a portion where pen-input data is not displayed can be fixed, and the displayed data can be changed.

When transistors including an oxide semiconductor are used as the transistors Tr1 to Tr3, leakage can be reduced and therefore display can be refreshed by inputting a pulse in every frame only to the wiring G1.

<Configuration Examples of Pixel Portion and Driver Circuit>

Figure 4:
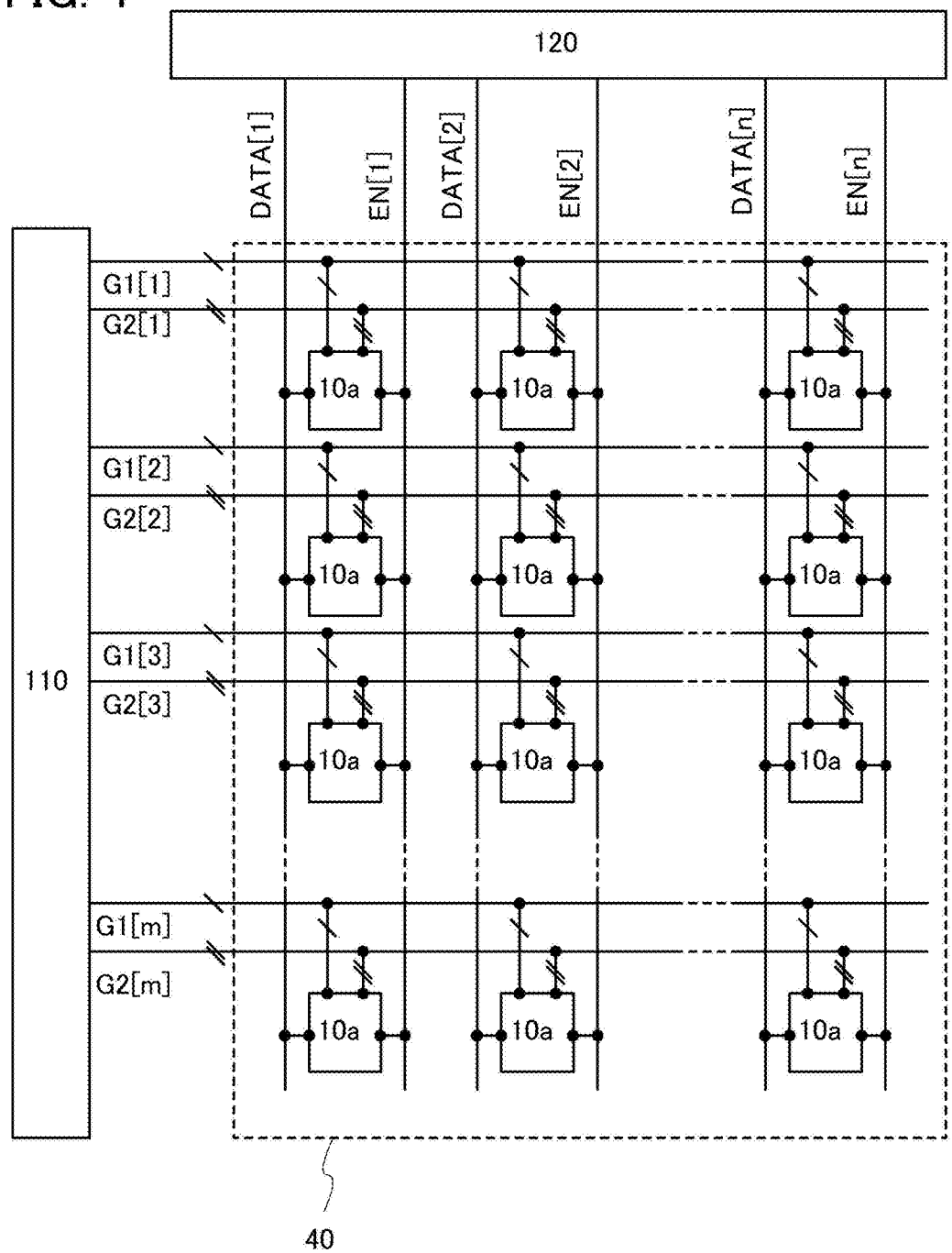
FIG. 4 illustrates a configuration of a pixel portion.

In FIG. 4, a pixel portion 40 includes a plurality of pixels 10a arranged in a matrix. The pixel portion 40 further includes wirings G1[1], G1[2], . . . , G1[m] and wirings G2[1], G2[2], . . . , G2[m] electrically connected to a driver circuit 110, and wirings DATA[1], DATA[2], . . . , DATA[n] and wirings EN[1], EN[2], . . . , EN[n] electrically connected to a driver circuit 120.

The pixel 100 illustrated in FIG. 1 can be used as each of the pixels 10a.

Note that the kinds and numbers of the wirings can be determined depending on the configuration, number, and position of the pixels 10a. Specifically, in the pixel portion 40 in FIG. 4, the pixels are electrically connected to each other in a matrix of m rows and n columns. In the pixel portion, the plurality of wirings (the wirings G1[1], G1[1], . . . , G1[m] and the wirings G2[1], G2[2], . . . , G2[m]) are provided.

Figure 5A:
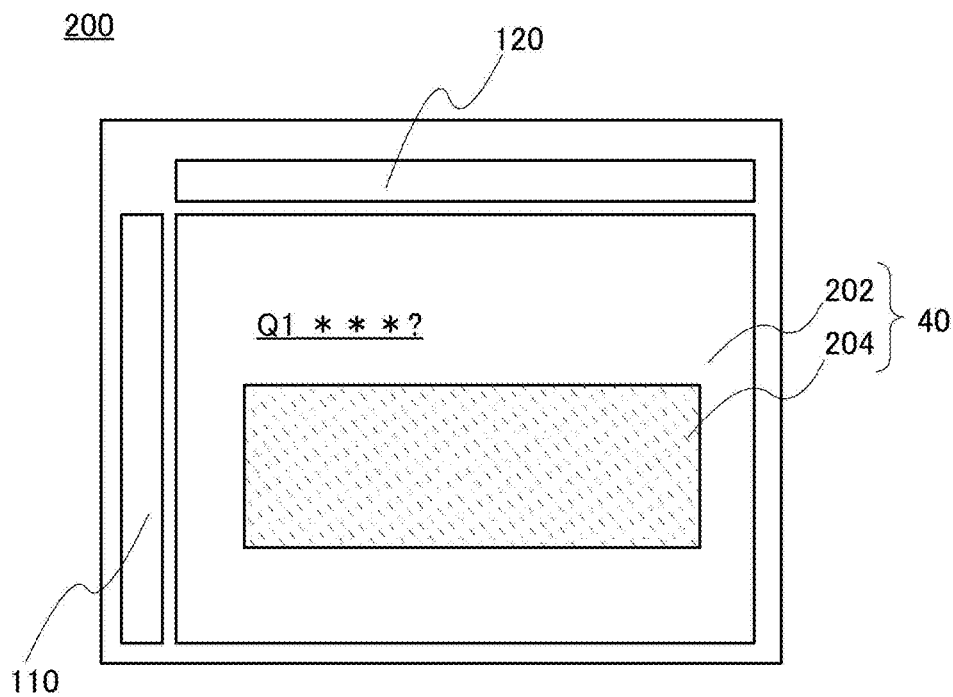
FIGS. 5A and 5B schematically illustrate display states of a display device of one embodiment of the present invention.
Figure 5B:
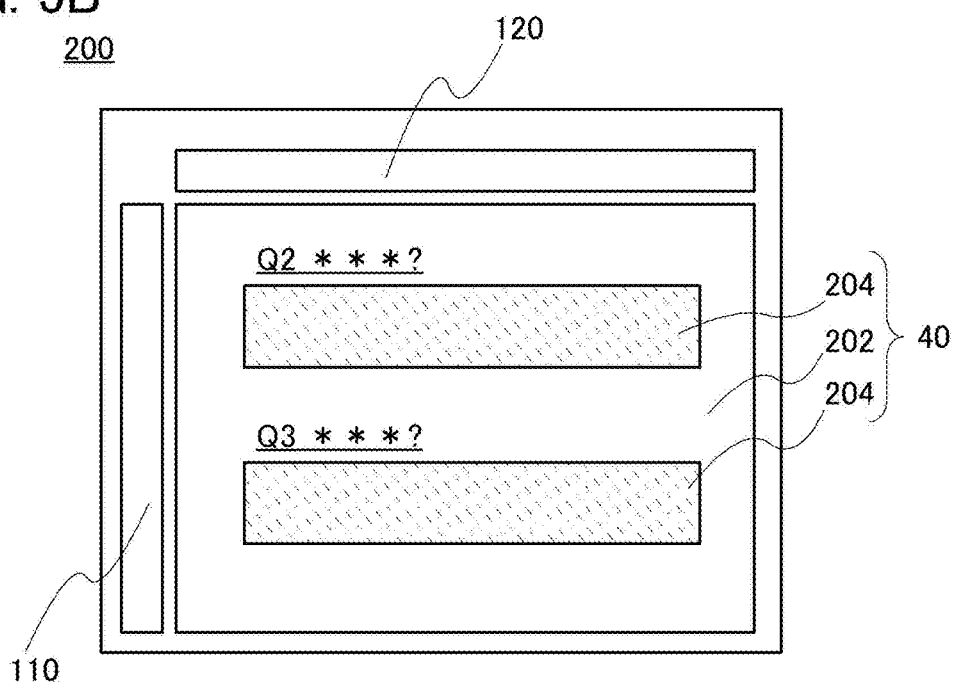

FIGS. 5A and 5B illustrate operation examples in which the pixel 100 illustrated in FIG. 1 is used in a display device 200. FIGS. 5A and 5B illustrate states in which two types of test answer sheets are displayed. For example, the above-described pixel portion 40 in which the plurality of pixels 10a are arranged in a matrix can be used in the display device 200.

The pixel portion 40 of the display device 200 includes at least two regions, i.e., a region 202 and a region 204. The region 202 displays a question or the like and does not display pen-input data. The region 204 is an answer section and can display pen-input data. According to the above-described operation example, the wirings EN of the pixel circuits in the region 202 are set high, whereby the liquid crystal orientation in the pixels does not change by input with a pen. In contrast, the wirings EN of the pixel circuits in the region 204 are set low, whereby the orientation changes by input with a pen and input data can be displayed.

In one embodiment of the present invention, display in FIG. 5A can be changed to display in FIG. 5B.

To change display, all the liquid crystal elements in the pixel portion 40 are changed to the homeotropic state by applying a voltage to the liquid crystal elements, and after that, all the liquid crystal elements are changed to the planar state by rapidly changing the voltage to zero. Then, the liquid crystal elements in pixels selected as appropriate depending on the content to be displayed are changed to the focal conic state by voltage application. In this manner, a desired image can be displayed.

<Block Diagram of Liquid Crystal Display Device>

Figure 8:
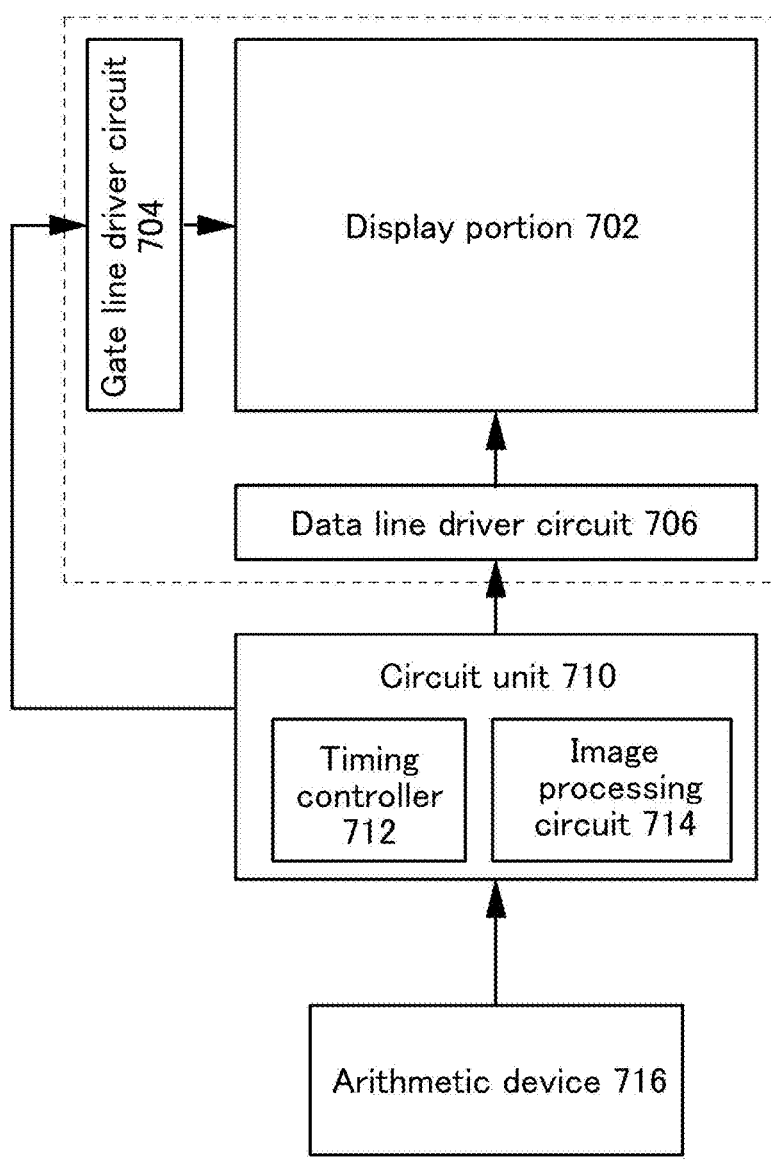
FIG. 8 is a block diagram of a display device of one embodiment of the present invention.

FIG. 8 is a block diagram illustrating a configuration of a display device 700 which is one embodiment of the present invention.

As illustrated in FIG. 8, the display device 700 includes a display portion 702 including pixels, a gate line driver circuit 704 for driving gate lines, a data line driver circuit 706 for applying a video voltage to a data line in each column, and an arithmetic device 716 for processing image data. The display device 700 further includes a circuit unit 710 which includes a timing controller 712 and an image processing circuit 714 for converting data from the arithmetic device 716 so that the data can be displayed as an image.

Figure 9A:
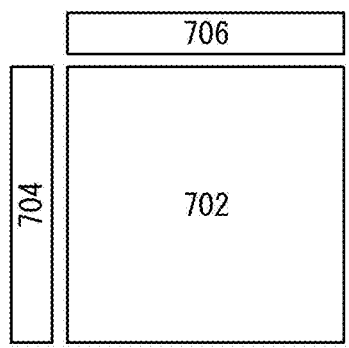
FIGS. 9A and 9B are each a block diagram of a display device of one embodiment of the present invention.
Figure 9B:
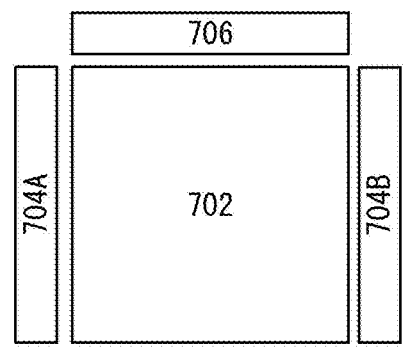

FIGS. 9A and 9B are block diagrams each illustrating the arrangement of the display portion including pixels, the gate line driver circuit for driving gate lines, and the data line driver circuit for applying a video voltage to a data line in each column.

For example, FIG. 9A illustrates the display portion 702, the gate line driver circuit 704, and the data line driver circuit 706.

In the case where there are a plurality of gate line driver circuits (704A and 704B), the gate line driver circuits may be provided on both sides of the display portion including pixels, as illustrated in FIG. 9B, for example.

<Top Views and Cross-Sectional Views of Pixel>

Next, examples of top views and examples of cross-sectional views of the pixel of the above-described display device will be described.

Figure 10A:
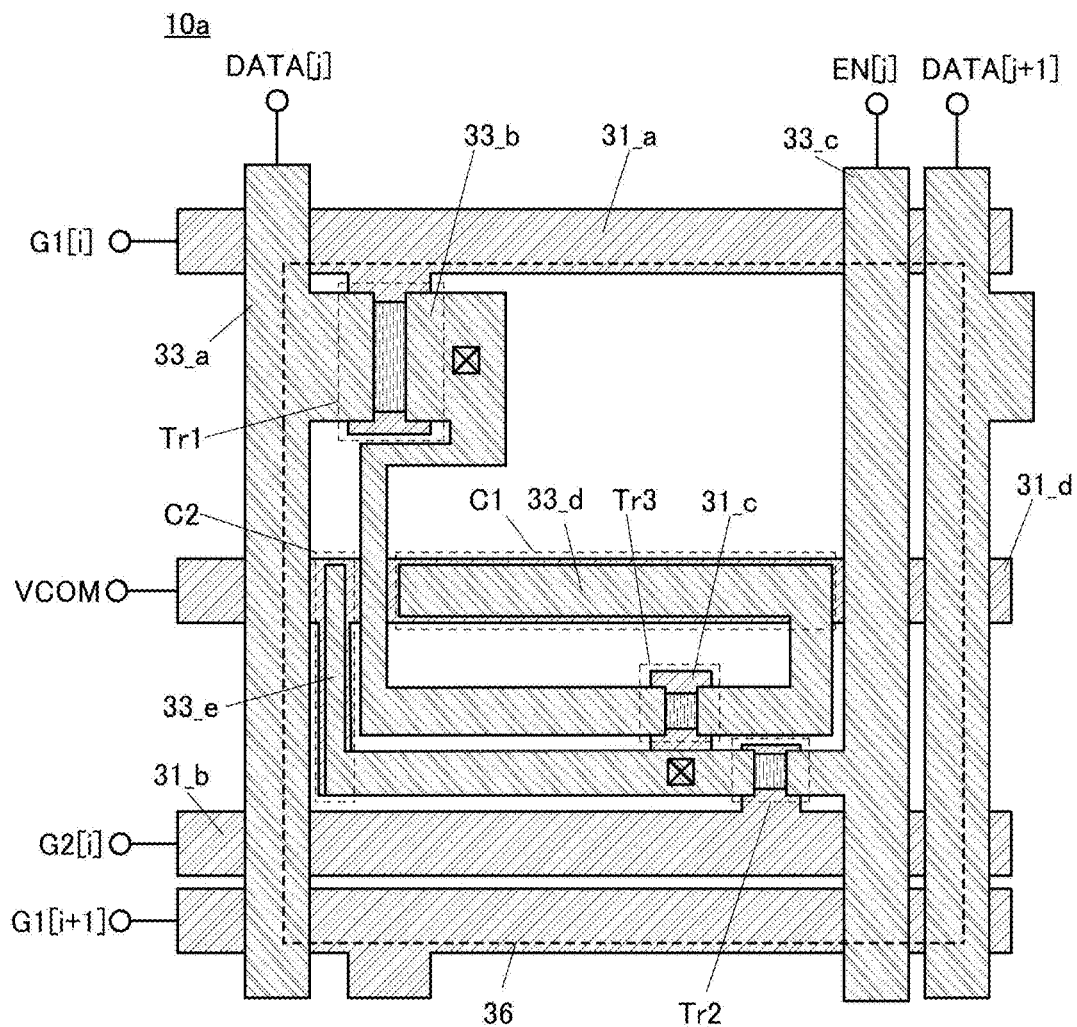
FIGS. 10A to 10C schematically illustrate a pixel of a display device of one embodiment of the present invention.
Figure 10B:
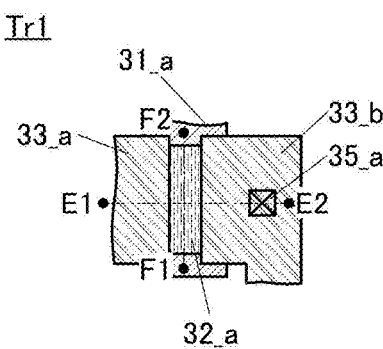
Figure 10C:
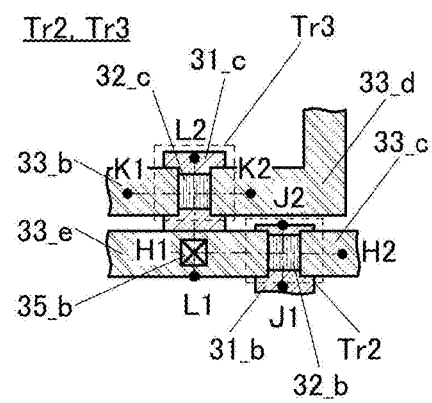

FIGS. 10A to 10C are schematic top views of one example of the pixel 10a. FIG. 10A is a top view of the pixel 10a. FIG. 10B illustrates the transistor Tr1 and conductive films therearound in the pixel 10a. FIG. 10C illustrates the transistors Tr2 and Tr3 and conductive films therearound in the pixel 10a.

Figure 11:
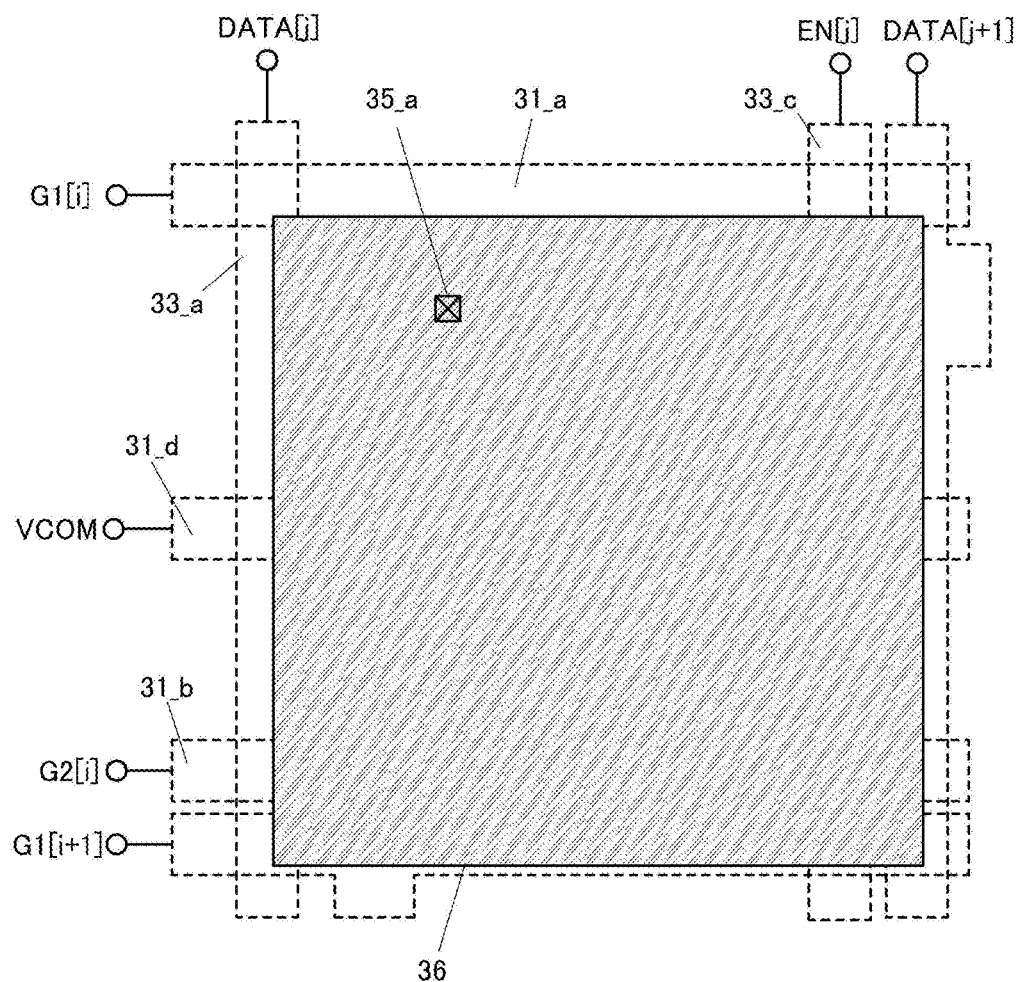
FIG. 11 schematically illustrates a pixel of a display device of one embodiment of the present invention.
Figure 12A:
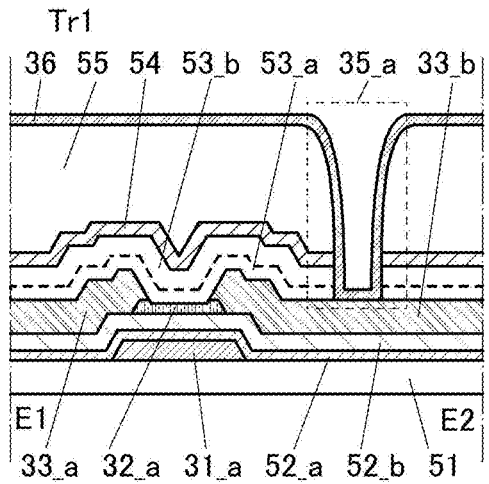
FIGS. 12A to 12F are cross-sectional views of a display device of one embodiment of the present invention.
Figure 12B:
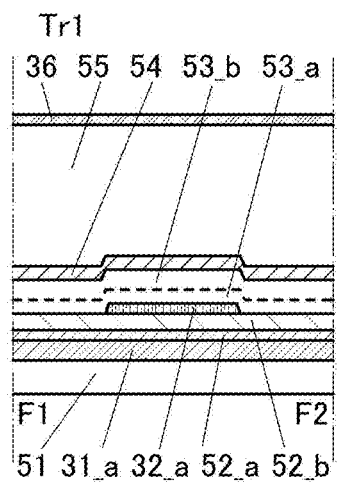
Figure 12C:
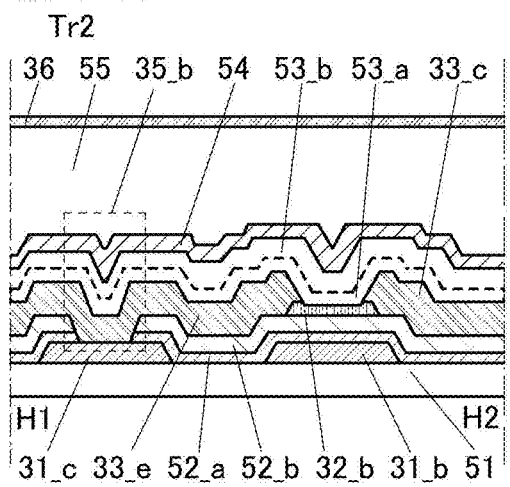
Figure 12D:
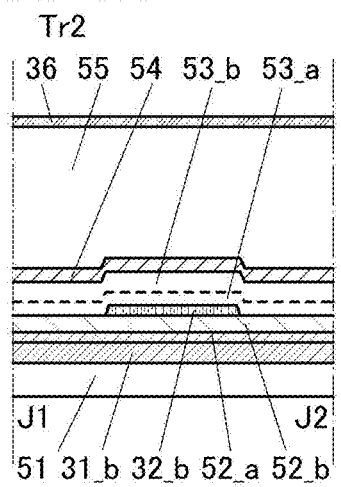
Figure 12E:
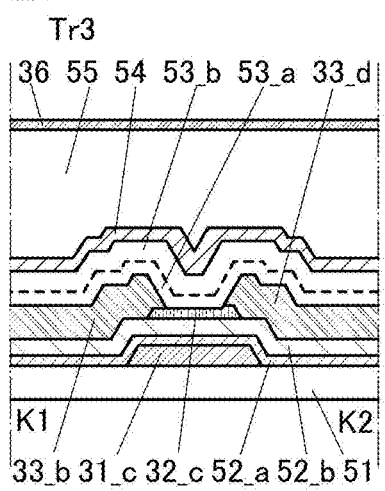
Figure 12F:
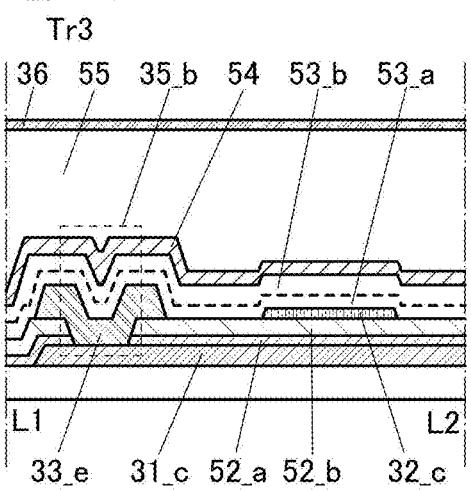

FIGS. 10A to 10C illustrate a wiring DATA[j], a wiring DATA[j+1], a wiring EN[j], a wiring G1[i], a wiring G2[i], and a wiring G1[i+1]. FIG. 11 is a top view illustrating the position of a conductive film over the components illustrated in the top views in FIGS. 10A to 10C. FIGS. 12A, 12B, 12C, 12D, 12E, and 12F correspond to cross-sectional views taken along dashed-dotted lines E1-E2, F1-F2, H1-H2, J1-J2, K1-K2, and L1-L2 in FIGS. 10A to 10C and FIG. 11, respectively.

FIGS. 10A to 10C illustrate conductive films $31\_a$, $31\_b$, $31\_c$, and $31\_d$, semiconductor films $32\_a$, $32\_b$, and $32\_c$, conductive films $33\_a$, $33\_b$, $33\_c$, $33\_d$, and $33\_e$, and openings $35\_a$ and $35\_b$. FIG. 11 illustrates a conductive film 36. Although components such as insulating films and a substrate are not illustrated in FIGS. 10A to 10C, the pixel includes a substrate 51, insulating films $52\_a$ and $52\_b$, insulating films $53\_a$ and $53\_b$, an insulating film 54, and an insulating film 55 as illustrated in FIGS. 12A to 12F. A substrate opposite to the substrate 51, a member provided on the substrate, and the like are not illustrated here, but may be employed as appropriate with reference to the following embodiments or the like.

The conductive films $31\_a$, $31\_b$, and $31\_c$ function as gate lines and gate electrodes of the transistors Tr1, Tr2, and Tr3.

The conductive film $31\_d$ functions as a power supply line to which a voltage VCOM is applied.

The semiconductor films $32\_a$, $32\_b$, and $32\_c$ include regions serving as channel formation regions of the transistors Tr1, Tr2, and Tr3.

The conductive films $33\_a$ and $33\_b$ function as a source line and a source or drain electrode of the transistor Tr1 (FIG. 10B).

The opening $35\_a$ reaches the conductive film $33\_b$ connected to the transistor, and the conductive film $33\_b$ is electrically connected to the conductive film 36. The conductive film 36 is illustrated in FIGS. 10A to 10C and FIG. 11, and in FIG. 10A, the position of the conductive film 36 is indicated by a dotted line. The conductive film 36 functions as one of the pair of electrodes of the above-described liquid crystal element. Note that the other of the pair of electrodes of the liquid crystal element, which is not illustrated in FIGS. 10A to 10C and FIG. 11, may be formed over the substrate 51 or may be formed over a substrate or the like different from the substrate 51 with the liquid crystal layer provided therebetween.

The conductive film $33\_c$ functions as the wiring EN[j] and functions as a source or drain electrode of the transistor Tr2 (FIG. 10C).

The conductive film $33\_e$ functions as a source or drain electrode of the transistor Tr2. The conductive film $33\_e$ is electrically connected to the conductive film $31\_c$ through the opening $35\_b$. There is a region where a portion of the conductive film $33\_e$ overlaps with the conductive film $31\_d$ with the insulating films $52\_a$ and $52\_b$ provided therebetween, and a capacitor C2 is formed in that region (FIGS. 10A and 10C).

The conductive film $33\_d$ functions as a source or drain electrode of the transistor Tr3. There is a region where a portion of the conductive film $33\_d$ overlaps with the conductive film $31\_d$ with the insulating films $52\_a$ and $52\_b$ provided therebetween, and a capacitor C1 is formed in that region (FIGS. 10A and 10C).

The shapes of the conductive films $31\_d$, $33\_d$, and $33\_e$ are determined so that the capacitors C1 and C2 have sufficient capacitances to retain charges necessary for operation.

The insulating films $52\_a$ and $52\_b$ function as gate insulating films. The insulating films $53\_a$, $53\_b$, 54, and 55 function as interlayer insulating films (FIGS. 12A to 12F).

Transparent conductive films may be used as the conductive films $31\_d$, $33\_b$, $33\_d$, $33\_e$, and 36.

The above-described components such as the conductive films, the substrate, and the insulating films will be described in more detail in Embodiment 3 or the like.

Note that this embodiment can be implemented in appropriate combination with any of the other embodiments.

Embodiment 2

In this embodiment, another configuration example of a display device which is one embodiment of the present invention will be described.

<Configuration Example 2 of Pixel>

The circuit in FIG. 1 in Embodiment 1 is a circuit for controlling whether to make a pixel writable or non-writable with external stress. An example of adding a circuit capable of reading and outputting data that is input with external stress and an example of an operation method thereof will be described with reference to FIGS. 13 and 14, FIGS. 15A to 15C, and FIGS. 16 to 18.

As described above, the liquid crystal orientation changes from the focal conic state to the planar state under external stress. This change in the orientation of liquid crystal molecules causes a change in dielectric constant of the liquid crystal layer, resulting in a change in capacitance of the liquid crystal element. This capacitance change is recognized outside the circuit.

Figure 13:
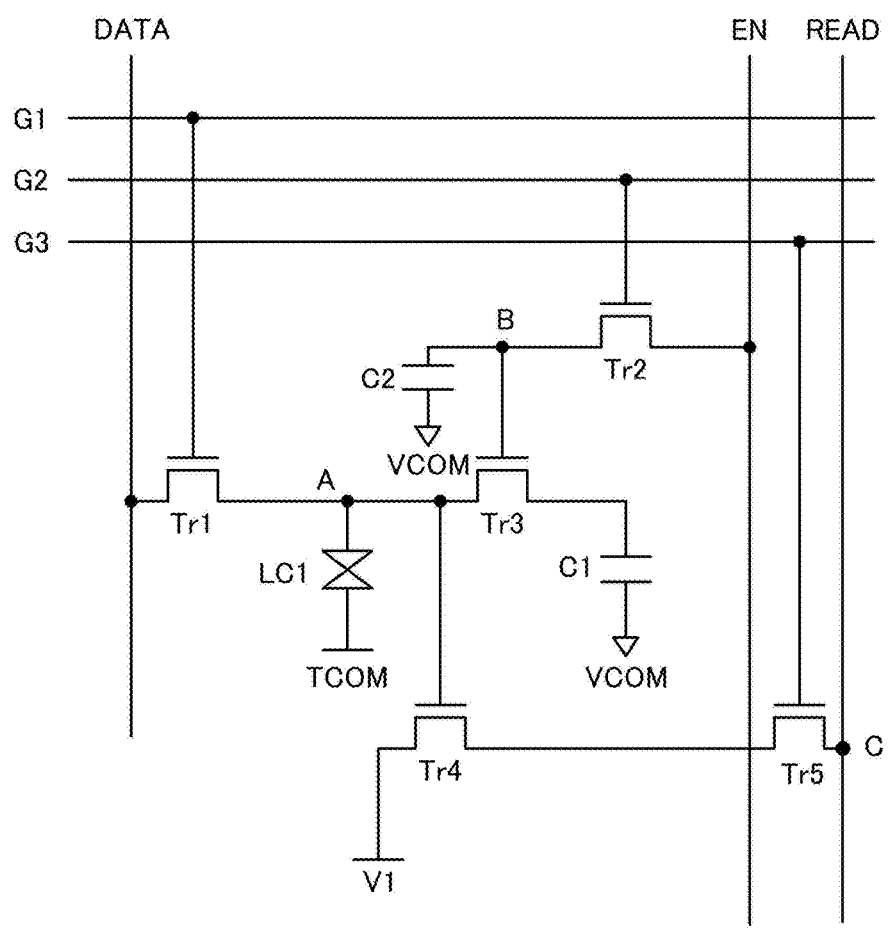
FIG. 13 illustrates a configuration of a pixel.

Specifically, as illustrated in FIG. 13, in addition to the circuit in FIG. 1, a gate of a transistor Tr4 is electrically connected to one terminal of the transistor Tr3; a voltage V1 is applied to a first terminal of the transistor Tr4; a second terminal of the transistor Tr4 is electrically connected to a first terminal of a transistor Tr5; and a second terminal of the transistor Tr5 is electrically connected to a read wiring READ. A gate of the transistor Tr5 is electrically connected to a wiring G3. The voltage V1 is a given voltage, and may be at the same potential as the voltage VCOM applied to one terminal of each of the capacitors C1 and C2, for example.

A node of the second terminal of the transistor Tr5 and the wiring READ is denoted by a node C.

Figure 14:
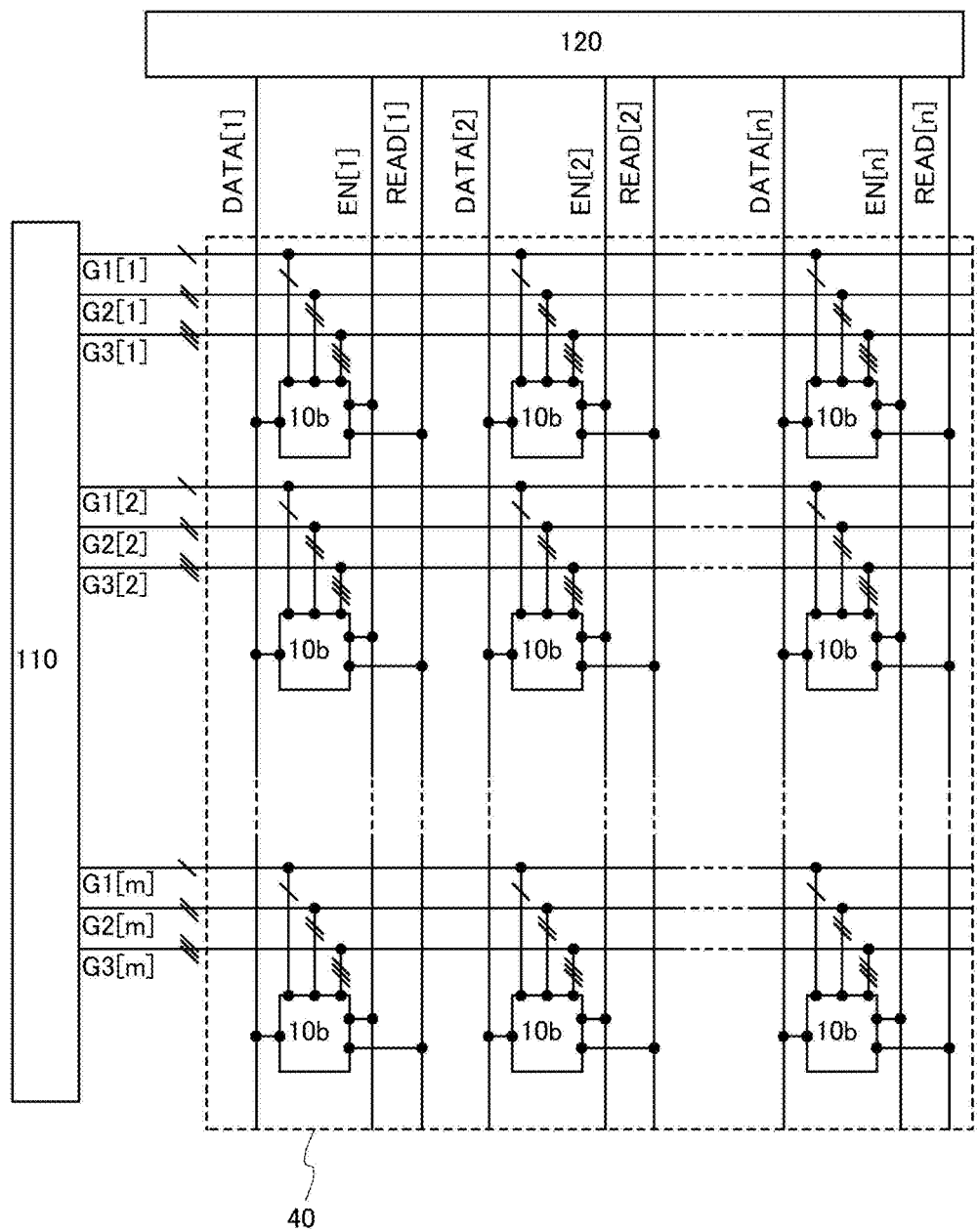
FIG. 14 illustrates a configuration of a pixel portion.

In FIG. 14, a pixel portion 40 includes a plurality of pixels 10b arranged in a matrix. The pixel portion 40 further includes wirings G1 and wirings G2 electrically connected to a driver circuit 110, and wirings DATA, wirings EN, and wirings READ electrically connected to a driver circuit 120.

Figure 15A:
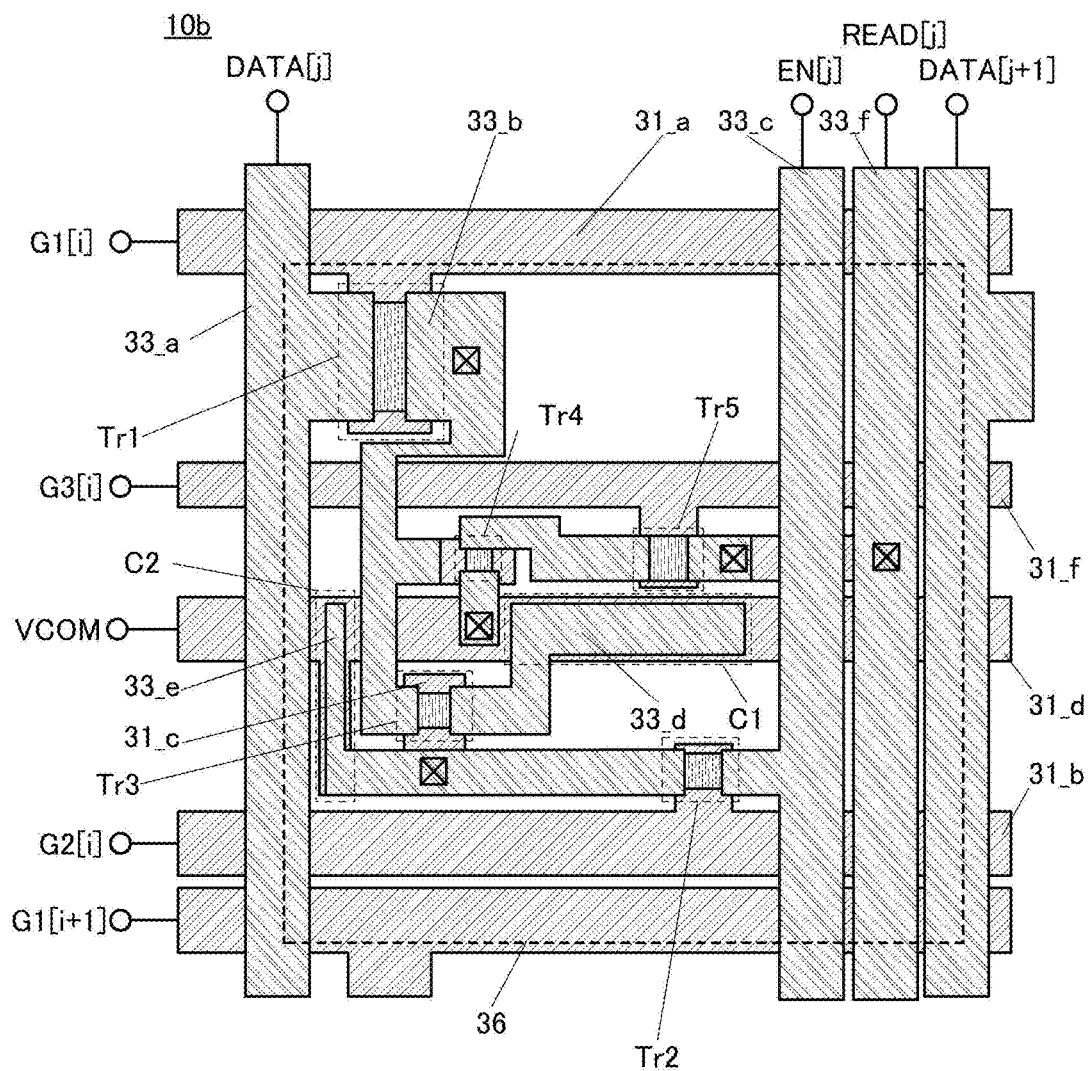
FIGS. 15A to 15C schematically illustrate a pixel of a display device of one embodiment of the present invention.
Figure 15B:
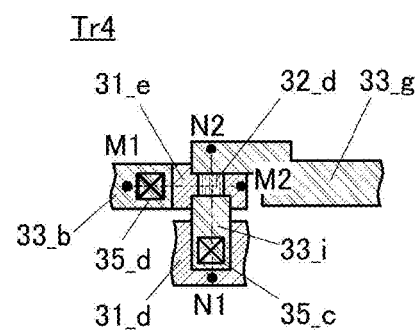
Figure 15C:
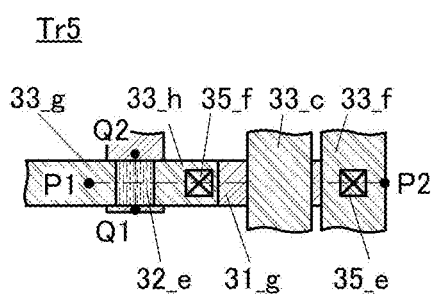
Figure 16:
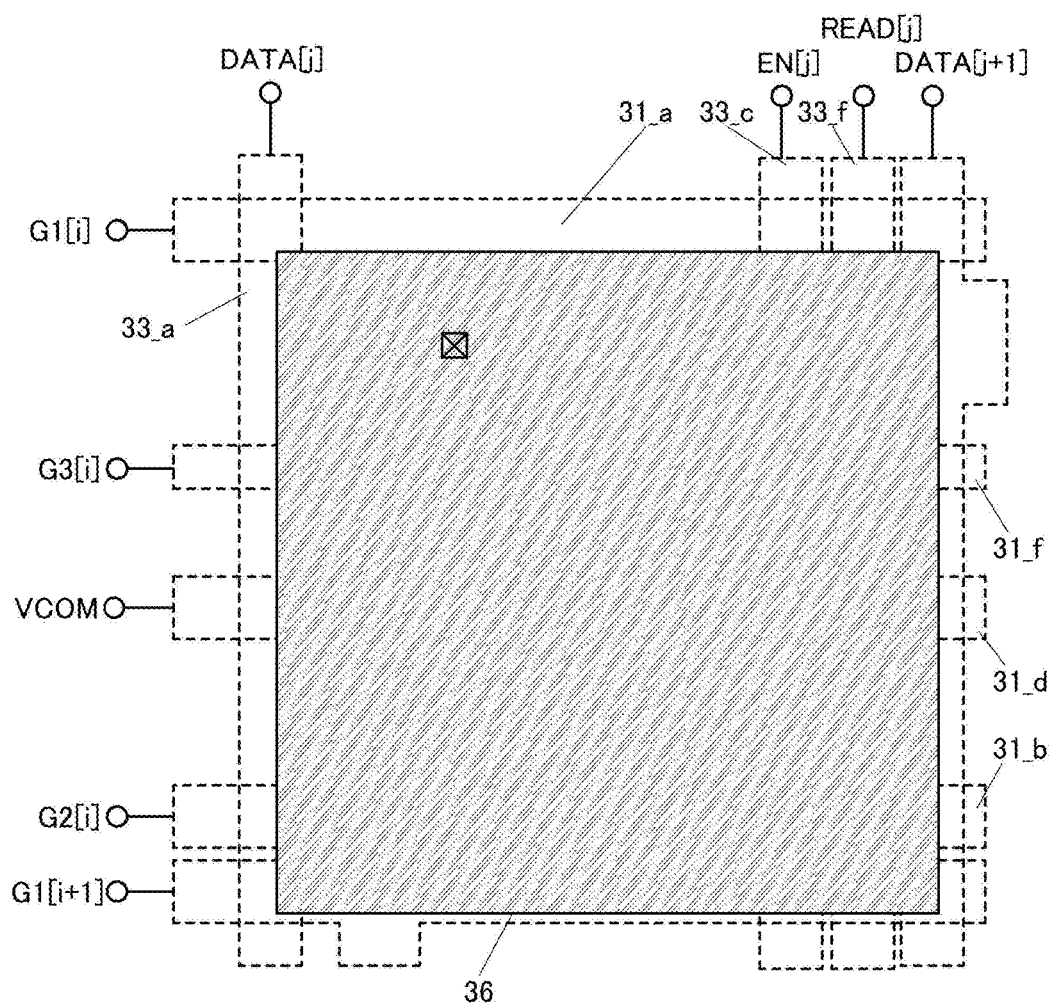
FIG. 16 schematically illustrates a pixel of a display device of one embodiment of the present invention.
Figure 17A:
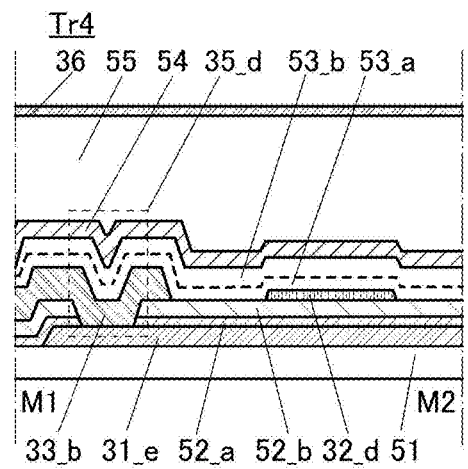
FIGS. 17A to 17D are schematic cross-sectional views of a pixel of a display device of one embodiment of the present invention.
Figure 17B:
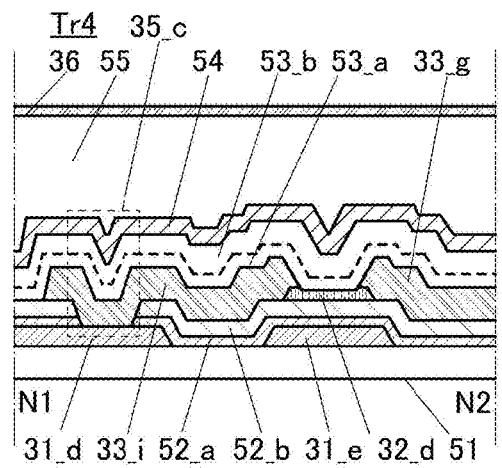
Figure 17C:
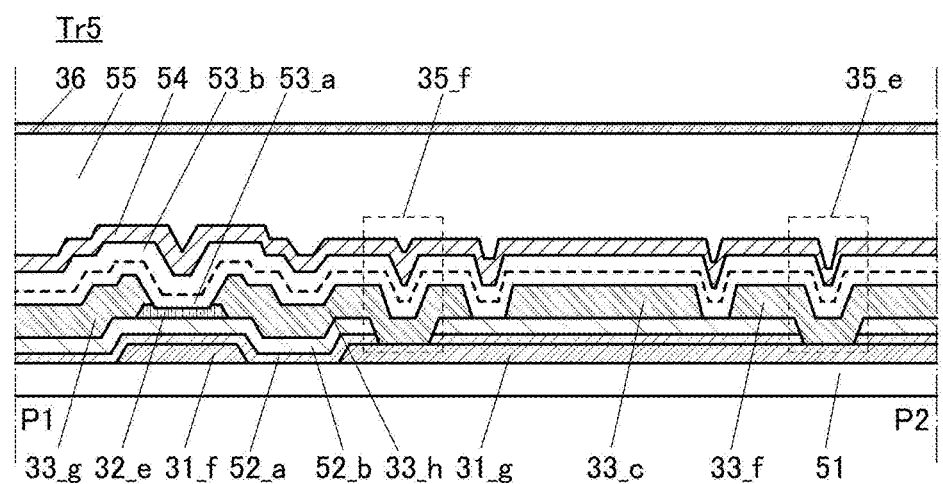
Figure 17D:
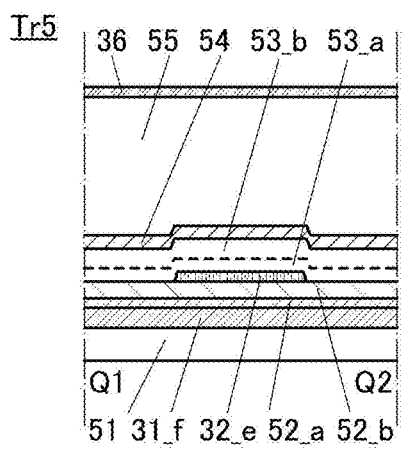

FIGS. 15A to 15C are schematic top views of one example of the pixel 10b in FIG. 14. FIGS. 15A to 15C illustrate a wiring DATA[j], a wiring DATA[j+1], a wiring EN[j], a wiring READ[j], a wiring G1[i], a wiring G2[i], a wiring G1[i+1], and a wiring G3[i]. FIG. 16 is a top view illustrating the position of a conductive film over the components illustrated in the top views in FIGS. 15A to 15C. FIGS. 17A, 17B, 17C, and 17D correspond to cross-sectional views taken along dashed-dotted lines M1-M2, N1-N2, P1-P2, and Q1-Q2 in FIGS. 15A to 15C, respectively.

FIGS. 15A to 15C illustrate conductive films 31_a to 31_g, semiconductor films 32_a to 32_e, conductive films 33_a to 33_i, and openings 35_a to 35_f. Although components such as insulating films and a substrate are not illustrated in FIGS. 15A to 15C and FIG. 16, the pixel includes a substrate 51, insulating films 52_a and 52_b, insulating films 53_a and 53_b, an insulating film 54, and an insulating film 55 as illustrated in FIGS. 17A to 17D. A substrate opposite to the substrate 51, a member provided on the substrate, and the like are not illustrated here, but may be employed as appropriate with reference to the following embodiments or the like.

The conductive films 31_a, 31_b, 31_c, 31_d, 31_e, 31_f, and 31_g function as gate lines and gate electrodes of the transistors Tr1, Tr2, Tr3, Tr4, and Tr5.

The description in Embodiment 1, FIGS. 10A to 10C, and FIGS. 11 and 12 can be referred to for the structures of the transistors Tr1, Tr2, and Tr3.

The insulating films 52_a and 52_b function as gate insulating films. The insulating films 53_a, 53_b, 54, and 55 function as interlayer insulating films.

Transparent conductive films may be used as the conductive films 31_d, 33_b, 33_d, 33_e, and 36.

The conductive film 33_b is electrically connected to the conductive film 31_e through the opening 35_d. The conductive film 31_e functions as the gate electrode of the transistor Tr4.

The conductive film 33_i functions as a source or drain electrode of the transistor Tr4 and is electrically connected to the conductive film 31_d through the opening 35_c.

The conductive film 33_g functions as a source or drain electrode of the transistor Tr4 and also functions as a source or drain electrode of the transistor Tr5.

In the transistor Tr5, the conductive film 33_g functions as a source or drain electrode, and is electrically connected to the conductive films 33_f, 31_g, and 33_h through the openings 35_e and 35_f as illustrated in FIGS. 15A to 15C.

Figure 18:
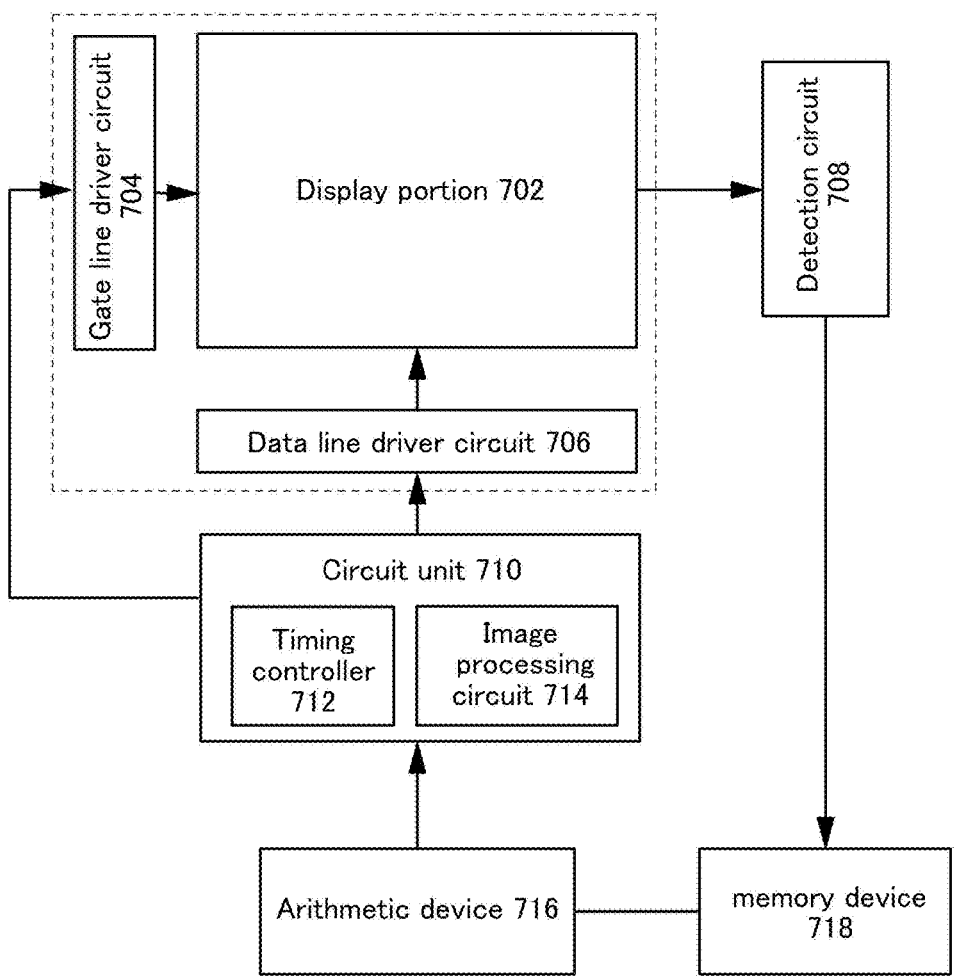
FIG. 18 is a block diagram of a display device of one embodiment of the present invention.

FIG. 18 is a block diagram illustrating a configuration of the display device 700 capable of storing data written in the display portion 702 and displaying the stored data again.

As illustrated in FIG. 18, the display device 700 includes the display portion 702 including pixels, the gate line driver circuit 704 for driving gate lines, the data line driver circuit 706 for applying a video voltage to a data line in each column, a detection circuit 708 for detecting written data that is read from the pixels of the display portion 702, a memory device 718 for storing data from the detection circuit, the arithmetic device 716 for processing image data, and the circuit unit 710 which includes the timing controller 712 and the image processing circuit 714 for converting data from the arithmetic device so that the data can be displayed as an image.

First, when data is input with external stress to a pixel which is determined to be writable according to the above-described method, the capacitance of the liquid crystal element changes and the voltage of the node A changes accordingly. Since a voltage applied to the gate of the transistor Tr4 at the same potential as the node A changes, a voltage between the source and drain of the transistor Tr4 changes through the input.

To read the data input to the pixel portion, the wiring G3 is set high to turn on the transistor Tr5; the voltage of the node C differs between a pixel to which data is input and a pixel to which data is not input. When the detection circuit 708 is electrically connected to the wiring READ, the voltage of the node C in each pixel can be read.

By performing this operation on each pixel of the display portion 702, data written in the display portion 702 can be read.

When the detection circuit 708 is connected to the memory device 718 as illustrated in FIG. 18, the written data can be stored. When the memory device 718 has a function of allocating coordinate data of each pixel to the thus read data, the coordinate data can be given to the written data.

When the memory device 718 also has an output function, the data stored in the memory device 718 can be read to reproduce and display the data written in the display portion 702. When the memory device 718 is connected to the arithmetic device 716, data from the memory device 718 can be processed by the arithmetic device 716.

When data from the memory device 718 is received and processed by the arithmetic device 716 and the processed data is then output to the circuit unit 710, data written in the display portion 702 can be displayed again as an image.

Note that this embodiment and the other embodiments can be referred to for the structures, materials, and the like used for the transistors Tr4 and Tr5, the wiring G3, and the wiring READ.

This embodiment can be implemented in appropriate combinations with any of the other embodiments.

Embodiment 3

<Cross-Sectional Structure Example of Liquid Crystal Display Device>
<General Description of Components>

FIG. 19A is a top view of a liquid crystal display device 300. FIG. 19C is a cross-sectional view taken along dashed-dotted lines A-B, C-D, and E-F in FIG. 19A.

As illustrated in FIG. 19A, the liquid crystal display device 300 includes a display portion 301 and gate line driver circuits 302. The display portion 301 includes a plurality of pixels 303, a plurality of data lines, and a plurality of gate lines, and has a function of displaying an image. Moreover, the display portion 301 also serves as an input portion. The gate line driver circuit 302 has a function of outputting a scan signal to the gate lines included in the display portion 301. The pixels 303 may each include a plurality of subpixels.

<General Description of Cross Section of Display Device>

As illustrated in FIG. 19C, the liquid crystal display device 300 includes a transistor 201_a, transistors 203_a to 203_c, a connection portion 205_a, a liquid crystal element 207_a, and the like over a substrate 211. FIG. 19C illustrates the cross section of one pixel as an example of the display portion 301.

The transistors 203_a to 203_c illustrated in FIG. 19C correspond to the transistors Tr1 to Tr3 in Embodiment 1. Although not illustrated in FIG. 19C, two more transistors can be added so that a circuit of the pixel corresponds to the circuit of the pixel described in Embodiment 2.

<Peripheral Driver Circuits>

Although FIG. 19A illustrates an example in which the liquid crystal display device 300 includes the gate line driver circuits 302 and a data line driver circuit 304, one embodiment of the present invention is not limited to this example. The liquid crystal display device 300 may include none of the gate and data line driver circuits, or may include any one or more of the gate and data line driver circuits.

In the liquid crystal display device 300, an IC 268 may be mounted on the substrate 211 by a COG method or the like as illustrated in FIG. 19B. The IC 268 includes, for example, any one or more of data and gate line driver circuits.

An IC may be mounted on an FPC 269. For example, an IC including any one or more of data and gate line driver circuits may be mounted on the FPC 269. For example, the IC may be mounted on the FPC 269 by a COF method or a tape automated bonding (TAB) method.

<Transistor>

The transistors 201_a and 203_a to 203_c each include a gate electrode 221, an insulating film 213, an insulating film 215, an oxide semiconductor film 223, a source electrode 225_a, and a drain electrode 225_b.

The transistors 201_a and 203_a to 203_c are covered with an insulating film 217 and an insulating film 219. Note that the insulating films 217 and 219 can be regarded as the components of the transistors 201_a and 203_a. The insulating film 217 preferably has an effect of suppressing diffusion of impurities into a semiconductor included in a transistor. For example, for the insulating film 217, a material through which impurities such as water and hydrogen are hardly diffused is preferably used. As the insulating film 219, an insulating film having a planarization function is preferably selected in order to reduce surface unevenness due to the transistor.

In each of the transistors 201_a and 203_a to 203_c, the oxide semiconductor film 223 is used as a semiconductor layer.

The resistivity of an oxide semiconductor can be easily controlled in a manufacturing process of the liquid crystal display device; thus, an oxide semiconductor can be favorably used as a material of a semiconductor film and a conductive film. When two or more layers included in the liquid crystal display device are formed using oxide semiconductors containing the same metal element, the same manufacturing apparatus (e.g., deposition apparatus or processing apparatus) can be used in two or more steps and manufacturing cost can thus be reduced.

An oxide semiconductor is a material that transmits visible light and can therefore be favorably used for an element that transmits visible light. Thus, even when used as a wiring, an oxide semiconductor does not decrease an aperture ratio and can transmit a signal.

The transistors 201_a and 203_a to 203_c each preferably include the oxide semiconductor film 223 that is highly purified to reduce the formation of oxygen vacancies. Accordingly, the current in an off state (off-state current) of the transistors can be made small. Thus, an electrical signal such as an image signal can be held for a longer period, and a writing interval can be set longer in an on state. Accordingly, the frequency of refresh operation can be reduced, which leads to an effect of reducing power consumption.

In addition, the transistors 201_a and 203_a to 203_c can have relatively high field-effect mobility and is thus capable of high-speed operation. With such a transistor that can operate at high speed used for the liquid crystal display device, a transistor in a display portion and a transistor in a driver circuit portion can be formed over one substrate. That is, a semiconductor device formed using a silicon wafer or the like is not additionally needed as a driver circuit, whereby the number of components of the liquid crystal display device can be reduced. In addition, the transistor that can operate at high speed can be used also in the display portion, whereby a high-quality image can be provided.

<Liquid Crystal Element>

The liquid crystal element 207_a is a liquid crystal element including a cholesteric liquid crystal. The liquid crystal element 207_a includes a conductive film 251, a conductive film 252, and a liquid crystal 249. Orientation of the liquid crystal 249 can be controlled with an electric field generated between the conductive films 251 and 252. The conductive film 251 can serve as a pixel electrode. The conductive film 252 can serve as a common electrode. When the conductive film 252 is electrically connected to a conductive film 231 using, for example, a conductive material which is not illustrated, a voltage can be applied to the conductive film 252 from the outside through the FPC 269 described below.

When a conductive material that transmits visible light is used for the conductive films 251 and 252, the liquid crystal display device 300 can serve as a transmissive liquid crystal display device. When a conductive material that reflects visible light is used for the conductive film 251 and a conductive material that transmits visible light is used for the conductive film 252, the liquid crystal display device 300 can serve as a reflective liquid crystal display device.

For example, a material containing one of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide to which silicon oxide is added, zinc oxide, and zinc oxide to which gallium is added are given, for example. Note that a film including graphene can be used as well. The film including graphene can be formed, for example, by reducing a film containing graphene oxide.

An oxide conductor film is preferably used as the conductive film 251. Furthermore, an oxide conductor film is preferably used as the conductive film 252. The oxide conductor film preferably contains one or more kinds of metal elements included in the oxide semiconductor film 223. For example, the conductive film 251 preferably contains indium, and is further preferably an In-M-Zn oxide (M is Al, Ti, Ga, Y, Zr, La, Ce, Nd, Sn, or Hf) film. Similarly, the conductive film 252 preferably contains indium, and is further preferably an In-M-Zn oxide film.

Note that at least one of the conductive films 251 and 252 may be formed using an oxide semiconductor. As described above, when two or more layers constituting a part of the liquid crystal display device are formed using oxide semiconductors containing the same metal element, the same manufacturing apparatus (e.g., deposition apparatus or processing apparatus) can be used in two or more steps and manufacturing cost can thus be reduced.

The conductive film 251 has a flat shape. An insulating film 253 may be provided between the conductive film 251 and the insulating film 219, as illustrated in FIG. 19C.

For example, when a silicon nitride film containing hydrogen is used as the insulating film 253 and an oxide semiconductor is used for the conductive film 251, the conductivity of the oxide semiconductor can be increased owing to hydrogen supplied from the insulating film 253.

Examples of a conductive material that reflects visible light include aluminum, silver, and an alloy including any of these metal elements.

The conductive film 251 functioning as a pixel electrode is electrically connected to a source or a drain of the transistor 203_a. Here, the conductive film 251 is electrically connected to the drain electrode 225_b.

<Connection Portion>

The connection portion 205_a is electrically connected to an external input terminal through which a signal (e.g., a video signal, a clock signal, a start signal, or a reset signal) or a potential from the outside is transmitted to the gate line driver circuit 302. Here, an example in which the FPC 269 is provided as the external input terminal is described.

The connection portion 205_a includes the conductive film 231 over the insulating film 213, and a conductive film 233 over the conductive film 231. The conductive film 231 is electrically connected to a connector 267 via the conductive film 233. The conductive film 233 is electrically connected to the FPC 269 via the connector 267.

The conductive film 231 can be formed using the same material and the same step as those of the source electrode 225_a and the drain electrode 225_b included in each of the transistors 201_a and 203_a to 203_c. The conductive film 233 can be formed using the same material and the same step as those of the conductive film 251 included in the liquid crystal element 207_a. It is preferable to form the conductive films included in the connection portion 205_a using the same materials and the same steps as an electrode or a wiring used for a display portion or a driver circuit portion in such a manner because an increase in the number of steps can be prevented.

<Light-Blocking Film>

A substrate 261 is provided with a light-blocking film 243 and an insulating film 245. FIG. 19C illustrates an example in which the substrate 261 has a smaller thickness than the substrate 211; however, one embodiment of the present invention is not limited to this example. One of the substrates 261 and 211 may be thinner than the other, or the substrates 261 and 211 may have the same thickness.

The light-blocking film 243 partly overlaps with at least one of the transistors 201_a and 203_a to 203_c.

The insulating film 245 preferably has a function of an overcoat preventing impurities contained in the light-blocking film 243 and the like from diffusing into the liquid crystal 249. The insulating film 245 is not necessarily provided.

<Alignment Films>

Note that alignment films may be provided on sides of the substrates 211 and 261 which are in contact with the liquid crystal 249. The alignment films can control the alignment of the liquid crystal 249. In the structure in FIG. 19C, for example, an alignment film that covers the conductive film 252 may be provided, or an alignment film may be provided between the insulating film 245 and the liquid crystal 249. The insulating film 245 may function as both an alignment film and an overcoat.

<Structure Body (Spacer)>

The liquid crystal display device 300 includes a spacer 247. The spacer 247 has a function of preventing the distance between the substrate 211 and the substrate 261 from being shorter than or equal to a certain distance.

FIG. 19C shows an example in which the spacer 247 is provided over the insulating film 253 and the conductive film 252; however, one embodiment of the present invention is not limited to this example. The spacer 247 may be provided on the substrate 211 side or on the substrate 261 side. For example, the spacer 247 may be formed on the insulating film 245. Moreover, although FIG. 19C shows an example in which the spacer 247 is in contact with the insulating films 253 and 245, the spacer 247 is not necessarily in contact with a component provided on the substrate 211 side or on the substrate 261 side.

A particulate spacer may be used as the spacer 247. Although a material such as silica can be used for the particulate spacer, an elastic material such as a resin or rubber is preferably used. In that case, the particulate spacer may be vertically crushed.

<Sealant>

The substrates 211 and 261 are attached to each other with an adhesive layer 265. A region surrounded by the substrate 211, the substrate 261, and the adhesive layer 265 is filled with the liquid crystal 249.

<Optical Film (Polarizing Plate)>

Note that when the liquid crystal display device 300 serves as a transmissive liquid crystal display device, two polarizing plates may be placed so that a display portion is interposed between the two polarizing plates. Light from a light source provided outside the polarizing plate enters through the polarizing plate. At this time, the alignment of the liquid crystal 249 is controlled with a voltage applied between the conductive films 251 and 252, whereby optical modulation of light can be controlled. In other words, the intensity of light emitted through the polarizing plate can be controlled.

When the liquid crystal display device 300 functions as a transmissive liquid crystal display device and is provided with a reflection plate which reflects light or an absorption plate which absorbs light under the substrate 211, the liquid crystal display device 300 can also function as a reflective liquid crystal display device because light transmitted through the liquid crystal display device 300 is reflected or absorbed by the reflection plate or the absorption plate.

The liquid crystal material may be mixed with a network of a resin or particles of a resin. As the resin, an acrylic resin, an epoxy resin, a vinyl resin, or the like can be used.

A substrate with which a sensing target, such as a finger or a stylus, is to be in contact may be provided above the substrate 261. In that case, a protective layer (such as a ceramic coat) is preferably provided over the above substrate. The protective layer can be formed using an inorganic insulating material such as silicon oxide, aluminum oxide, yttrium oxide, or yttria-stabilized zirconia (YSZ). Alternatively, tempered glass may be used for the substrate. The tempered glass that can be used here is one that has been subjected to physical or chemical treatment by an ion exchange method, a thermal tempering method, or the like and has a surface to which compressive stress has been applied.

<Use of Back Gate>

Note that the transistors may each include a conductive film that can function as a gate, in addition to the gate electrode 221.

FIGS. 20A to 20C illustrate a structure in which the transistors of the display device each include the gate electrode 221 and an oxide conductor film 227.

The transistor 201_a has a structure in which an oxide semiconductor film where a channel is formed is sandwiched between two gates. The gate electrode 221 is electrically connected to the oxide conductor film 227. Transistors having such a structure in which two gates are electrically connected to each other can have a higher field-effect mobility and thus have higher on-state current than other transistors. Consequently, a circuit capable of high-speed operation can be obtained. Furthermore, the area occupied by a circuit portion can be reduced. The use of a transistor having high on-state current can reduce signal delay in wirings and can suppress display unevenness even in a liquid crystal display device in which the number of wirings is increased in accordance with the increase in size or resolution. Moreover, with such a structure, a highly reliable transistor can be formed.

The two gates of each of the transistors 203_a to 203_c may be supplied with different signals. In the case where different signals are supplied to the two gates of each of the transistors 203_a to 203_c to operate the transistor at different timing, the number of wirings for controlling the transistor can be decreased. As a result, the aperture ratio of the pixel can be increased, for example.

The transistors 201_a and 203_a to 203_c may have the same structure or different structures. That is, a transistor included in a driver circuit portion and a transistor included in a display portion may have the same structure or different structures.

In each of the transistors 201_a and 203_a to 203_c, the oxide semiconductor film 223 is used as a semiconductor layer, and the oxide conductor film 227 is used as a gate. In that case, it is preferable that the oxide semiconductor film 223 and the oxide conductor film 227 be formed using an oxide semiconductor.

Forming the oxide semiconductor film 223 and the oxide conductor film 227 using the same metal element can reduce the manufacturing cost. For example, when metal oxide targets with the same metal composition are used, the manufacturing cost can be reduced and the same etching gas or the same etchant can be used in processing the oxide semiconductor films. Even when the oxide semiconductor film 223 and the oxide conductor film 227 contain the same metal element, they have different compositions in some cases. For example, a metal element in a film is released during the manufacturing process of the liquid crystal display device, which might result in different metal compositions.

The transistors 203_a to 203_c illustrated in FIG. 20C correspond to the transistors Tr1 to Tr3 in Embodiment 1. Although not illustrated in FIG. 20C, two more transistors can be added so that a circuit of the pixel corresponds to the circuit of the pixel described in Embodiment 2.

Next, the details of the materials and the like that can be used for components of the liquid crystal display device of this embodiment are described. Note that description on the components already described is omitted in some cases. The materials described below can be used as appropriate for the liquid crystal display device described in a later embodiment and its components.

<<Substrate>>

There is no particular limitation on a material and the like of the substrate included in the liquid crystal display device 300 as long as the material has heat resistance high enough to withstand at least heat treatment to be performed later. For example, a glass substrate, a ceramic substrate, a quartz substrate, a sapphire substrate, or the like may be used. Alternatively, a single crystal semiconductor substrate or a polycrystalline semiconductor substrate made of silicon or silicon carbide, a compound semiconductor substrate made of silicon germanium or the like, an SOI substrate, or the like may be used as the substrate 211. Further alternatively, any of these substrates provided with a semiconductor element may be used as the substrate 211. In the case where a glass substrate is used as the substrate 211, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Alternatively, a flexible substrate may be used as the substrate 211, and the transistor, the capacitor, and the like may be provided directly on the flexible substrate.

The weight and thickness of the liquid crystal display device can be decreased by using a thin substrate. Furthermore, a flexible liquid crystal display device can be obtained by using a substrate that is thin enough to have flexibility.

Other than the above, a transistor can be formed using any of various substrates as the substrates 211 and 261. The type of the substrate is not limited to a certain type. Examples of the substrate include a plastic substrate, a metal substrate, a stainless steel substrate, a substrate including stainless steel foil, a tungsten substrate, a substrate including tungsten foil, a flexible substrate, an attachment film, paper including a fibrous material, a base material film, and the like. As an example of a glass substrate, a barium borosilicate glass substrate, an aluminoborosilicate glass substrate, a soda lime glass substrate, and the like can be given. Examples of a flexible substrate include a flexible synthetic resin such as plastics typified by polyethylene terephthalate (PET), polyethylene naphthalate (PEN), and polyether sulfone (PES), and acrylic. Examples of the attachment film include polypropylene, polyester, polyvinyl fluoride, and polyvinyl chloride. Examples of the base material film include polyester, polyamide, polyimide, an inorganic vapor deposition film, and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent characteristics or a transistor with low power consumption can be formed, a device with high durability can be formed, heat resistance can be provided, or reduction in weight or thickness can be achieved.

<<Transistor>>

There is no particular limitation on the structure of the transistor included in the liquid crystal display device of one embodiment of the present invention. For example, a planar transistor, a staggered transistor, or an inverted staggered transistor may be used. A top-gate transistor or a bottom-gate transistor may be used. Gate electrodes may be provided above and below a channel. There is no particular limitation on a semiconductor material used for the transistor, and an oxide semiconductor, silicon, or germanium can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

As a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because the off-state current of the transistor can be reduced.

For example, the oxide semiconductor preferably contains at least indium (In) or zinc (Zn). Further preferably, the oxide semiconductor contains an oxide represented by an In-M-Zn oxide (M is a metal such as Al, Ti, Ga, Ge, Y, Zr, Sn, La, Ce, Hf, or Nd).

As a semiconductor layer, it is particularly preferable to use an oxide semiconductor film including a plurality of crystal parts whose c-axes are aligned substantially perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film which is caused by stress when a display panel is bent is prevented. Therefore, such an oxide semiconductor can be preferably used for a flexible liquid crystal display device which is used in a bent state, or the like.

Moreover, the use of such an oxide semiconductor for the semiconductor layer makes it possible to provide a highly reliable transistor in which a variation in electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

Transistors including polysilicon films can form various functional circuits, such as a shift register circuit, a level shifter circuit, a buffer circuit, and a sampling circuit, because of their high field-effect mobility.

<<Oxide Semiconductor Film>>

The oxide semiconductor film 223 preferably includes a film represented by an In-M-Zn oxide that contains at least indium (In), zinc (Zn), and M (M is a metal such as Al, Ti, Ga, Y, Zr, La, Ce, Sn, or Hf). In order to reduce fluctuation in electrical characteristics of the transistors including the oxide semiconductor, the oxide semiconductor preferably contains a stabilizer in addition to indium, zinc, and M.

Examples of the stabilizer, including metals that can be used as M, are gallium (Ga), tin (Sn), hafnium (Hf), aluminum (Al), and zirconium (Zr). Other examples of the stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor included in the oxide semiconductor film 223, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

Note that in the case where the oxide semiconductor film 223 contains an In-M-Zn oxide, the proportions of In and M when the summation of In and M is assumed to be 100 atomic % are preferably as follows: the proportion of In is greater than 25 atomic % and the proportion of M is less than 75 atomic %, and more preferably, the proportion of In is greater than 34 atomic % and the proportion of M is less than 66 atomic %.

The energy gap of the oxide semiconductor film 223 is 2 eV or more, preferably 2.5 eV or more, further preferably 3 eV or more. With the use of an oxide semiconductor having such a wide energy gap, the off-state current of the transistor can be reduced.

The thickness of the oxide semiconductor film 223 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 223 contains an In-M-Zn oxide (M represents Al, Ga, Y, Zr, La, Ce, or Nd), it is preferable that the atomic ratio of metal elements of a sputtering target used for forming a film of the In-M-Zn oxide satisfy In M and Zn M As an example of the atomic ratio of metal elements of such a sputtering target, In:M:Zn=1:1:1, In:M:Zn=1:1:1.2, In:M:Zn=3:1:2, In:M:Zn=1:3:4, or In:M:Zn=1:3:6 can be given. Note that the proportion of each metal element in the atomic ratio of the oxide semiconductor film 223 may vary within a range of ±40% of that in the above atomic ratio of the sputtering target.

An oxide semiconductor film with a low carrier density is used as the oxide semiconductor film 223. For example, an oxide semiconductor film whose carrier density is $1\times10^{17}/cm^3$ or lower, preferably $1\times10^{15}/cm^3$ or lower, more preferably $1\times10^{13}/cm^3$ or lower, still more preferably $1\times10^{11}/cm^3$ or lower is used as the oxide semiconductor film 223.

Note that, without limitation to those described above, an oxide semiconductor with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 223 be set to be appropriate.

When silicon or carbon that is one of elements belonging to Group 14 is contained in the oxide semiconductor film 223, oxygen vacancies are increased in the oxide semiconductor film 223, and the oxide semiconductor film 223 becomes n-type. Thus, the concentration of silicon or carbon (measured by secondary ion mass spectrometry (SIMS)) in the oxide semiconductor film 223 is set to be lower than or equal to $2\times10^{18}$ atoms/cm$^3$, preferably lower than or equal to $2\times10^{17}$ atoms/cm$^3$.

The concentration of alkali metal or alkaline earth metal in the oxide semiconductor film 223, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 223.

Furthermore, when containing nitrogen, the oxide semiconductor film 223 easily becomes an n-type film by generation of electrons serving as carriers and an increase of carrier density. Thus, a transistor including an oxide semiconductor which contains nitrogen is likely to be normally-on. For this reason, nitrogen in the oxide semiconductor film is preferably reduced as much as possible; the nitrogen concentration which is measured by SIMS is preferably set to be, for example, lower than or equal to $5\times10^{18}$ atoms/cm$^3$.

The oxide semiconductor film 223 may have a non-single-crystal structure, for example. Non-single-crystal structures include a c-axis aligned crystalline oxide semiconductor (CAAC-OS) described later, a polycrystalline structure, a microcrystalline structure described later, and an amorphous structure. Among the non-single-crystal structures, the amorphous structure has the highest density of defect states, whereas the CAAC-OS has the lowest density of defect states.

The oxide semiconductor film 223 may have an amorphous structure, for example. An oxide semiconductor film having an amorphous structure has, for example, disordered atomic arrangement and no crystalline component. Alternatively, an oxide film having an amorphous structure has, for example, an absolutely amorphous structure and no crystal part.

Note that the oxide semiconductor film 223 may be a mixed film including two or more of the following: a region having an amorphous structure, a region having a microcrystalline structure, a region having a polycrystalline structure, a CAAC-OS region, and a region having a single crystal structure. The mixed film has a single-layer structure including, for example, two or more of a region having an amorphous structure, a region having a microcrystalline structure, a region having a polycrystalline structure, a CAAC-OS region, and a region having a single crystal structure in some cases. Furthermore, the mixed film has a stacked-layer structure including, for example, layers of two or more of a region having an amorphous structure, a region having a microcrystalline structure, a region having a polycrystalline structure, a CAAC-OS region, and a region having a single crystal structure in some cases.

Alternatively, silicon is preferably used as a semiconductor in which a channel of the transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has a higher field-effect mobility and a higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which pixels are formed, and the number of components of an electronic device can be reduced.

<<Method for Controlling Resistivity of Oxide Semiconductor>>

An oxide semiconductor is a semiconductor material whose resistance can be controlled by oxygen vacancies in the film and/or the concentration of impurities such as hydrogen or water in the film. Thus, the resistivity of the oxide conductor film can be controlled by selecting treatment for increasing oxygen vacancies and/or impurity concentration on the oxide semiconductor film or treatment for reducing oxygen vacancies and/or impurity concentration on the oxide semiconductor film.

Note that such an oxide conductor film formed using an oxide semiconductor film can be referred to as an oxide semiconductor film having a high carrier density and a low resistance, an oxide semiconductor film having conductivity, or an oxide semiconductor film having high conductivity.

Specifically, plasma treatment is performed on an oxide semiconductor film to be the oxide conductor film 227 serving as a gate to increase oxygen vacancies and/or impurities such as hydrogen or water in the oxide semiconductor film; accordingly, the oxide semiconductor film can have a high carrier density and a low resistance. Alternatively, the insulating film 217 containing hydrogen is formed in contact with the oxide semiconductor film to diffuse hydrogen from the insulating film 217 containing hydrogen to the oxide semiconductor film, so that the oxide semiconductor film can have a high carrier density and a low resistance.

The insulating film 215 is formed over the oxide semiconductor film 223 so that the oxide semiconductor film 223 is not subjected to the above plasma treatment. Since the insulating film 215 is provided, the oxide semiconductor film 223 is not in contact with the insulating film 217 containing hydrogen. The insulating film 215 can be formed using an insulating film capable of releasing oxygen, in which case oxygen can be supplied to the oxide semiconductor film 223. The oxide semiconductor film 223 to which oxygen is supplied is an oxide semiconductor in which oxygen vacancies in the film or at the interface are reduced and which has a high resistance. Note that as the insulating film capable of releasing oxygen, a silicon oxide film or a silicon oxynitride film can be used, for example.

To obtain an oxide semiconductor film having a low resistivity, hydrogen, boron, phosphorus, or nitrogen may be introduced into the oxide semiconductor film by an ion implantation method, an ion doping method, a plasma immersion ion implantation method, or the like.

As the plasma treatment to be performed on the oxide conductor film 227, plasma treatment using a gas containing one of a rare gas (He, Ne, Ar, Kr, or Xe), phosphorus, boron, hydrogen, and nitrogen is typical. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the plasma treatment, an oxygen vacancy is formed in a lattice from which oxygen is released (or in a portion from which oxygen is released) in the oxide conductor film 227. This oxygen vacancy can cause carrier generation. Furthermore, when hydrogen is supplied from an insulating film that is in the vicinity of the oxide conductor film 227, specifically, that is in contact with the lower surface or the upper surface of the oxide conductor film 227, and hydrogen enters the oxygen vacancy, an electron serving as a carrier might be generated. Accordingly, the oxide conductor film 227 whose oxygen vacancies are increased by the plasma treatment has a higher carrier density than the oxide semiconductor film 223.

The oxide semiconductor film 223 in which oxygen vacancies are reduced and the hydrogen concentration is reduced can be referred to as a highly purified intrinsic or substantially highly purified intrinsic oxide semiconductor film. The term "substantially intrinsic" refers to the state where an oxide semiconductor has a carrier density lower than $1\times10^{17}/cm^3$, preferably lower than $1\times10^{15}/cm^3$, further preferably lower than $1\times10^{13}/cm^3$. Furthermore, the state in which an impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). The highly purified intrinsic or substantially highly purified intrinsic oxide semiconductor film 223 has a low density of defect states and accordingly can have a low density of trap states.

Furthermore, the highly purified intrinsic or substantially highly purified intrinsic oxide semiconductor film 223 has an extremely low off-state current; even when an element has a channel width of $1\times10^6$ µm and a channel length (L) of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film 223 has a small variation in electrical characteristics and high reliability.

For example, an insulating film containing hydrogen, that is, an insulating film capable of releasing hydrogen, typically a silicon nitride film, is used as the insulating film 217, whereby hydrogen can be supplied to the oxide conductor film 227. The insulating film capable of releasing hydrogen preferably has a hydrogen concentration of $1\times10^{22}$ atoms/$cm^3$ or higher. Such an insulating film is formed in contact with the oxide conductor film 227, whereby hydrogen can be effectively contained in the oxide conductor film 227. In this manner, the above-described plasma treatment is performed and the structure of the insulating film in contact with the oxide semiconductor film (or the oxide conductor film) is changed, whereby the resistance of the oxide semiconductor film (or the oxide conductor film) can be appropriately adjusted.

Hydrogen included in the oxide conductor film 227 reacts with oxygen bonded to a metal atom to be water, and also causes oxygen vacancies in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the oxide conductor film 227 containing hydrogen has a higher carrier density than the oxide semiconductor film 223.

Hydrogen in the oxide semiconductor film 223 of the transistor in which a channel region is formed is preferably reduced as much as possible. Specifically, in the oxide semiconductor film 223, the hydrogen concentration measured by secondary ion mass spectrometry (SIMS) is set to lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than $5\times10^{18}$ atoms/$cm^3$, yet further preferably lower than or equal to $1\times10^{18}$ atoms/$cm^3$, yet still further preferably lower than or equal to $5\times10^{17}$ atoms/$cm^3$, even yet still further preferably lower than or equal to $1\times10^{16}$ atoms/$cm^3$.

On the other hand, the oxide conductor film 227 serving as a gate is a low-resistance oxide conductor film having a high hydrogen concentration and/or a large amount of oxygen vacancies as compared to the oxide semiconductor film 223.

The oxide semiconductor film 223 and the oxide conductor film 227 are typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor film 223 and the oxide conductor film 227 have a light-transmitting property.

Note that in the case of using an In-M-Zn oxide as the oxide semiconductor film 223, when the summation of In and M is assumed to be 100 atomic %, the proportions of In and M are preferably set to be greater than or equal to 25 atomic % and less than 75 atomic %, respectively, or greater than or equal to 34 atomic % and less than 66 atomic %, respectively.

The energy gap of the oxide semiconductor film 223 is 2 eV or more, 2.5 eV or more, or 3 eV or more.

The thickness of the oxide semiconductor film 223 can be greater than or equal to 3 nm and less than or equal to 200 nm, greater than or equal to 3 nm and less than or equal to 100 nm, or greater than or equal to 3 nm and less than or equal to 60 nm.

In the case where the oxide semiconductor film 223 contains an In-M-Zn oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the proportion of each metal element in the atomic ratio of the formed oxide semiconductor film 223 may vary within a range of ±40% of that in the above atomic ratio of the sputtering target.

Note that a material that can be used for the oxide conductor film 227 and a method for forming the oxide conductor film 227 can be applied to those for the conductive films 251 and 252.

<<Insulating Film>>

An organic insulating material or an inorganic insulating material can be used as an insulating material that can be used for the insulating film, the overcoat, the spacer, or the like included in the liquid crystal display device. Examples of resins include an acrylic resin, an epoxy resin, a polyimide resin, a polyamide resin, a polyamide-imide resin, a siloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

<<Conductive Film>>

For the conductive film such as the gate, the source, and the drain of a transistor and the wiring, the electrode, and the like of the liquid crystal display device, a single-layer structure or a stacked structure using any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film, a two-layer structure in which a titanium film is stacked over a tungsten film, a two-layer structure in which a copper film is stacked over a molybdenum film, a two-layer structure in which a copper film is stacked over an alloy film containing molybdenum and tungsten, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. In the case where the source electrode 225_a and the drain electrode 225_b have a three-layer structure, it is preferable that a film formed of titanium, titanium nitride, molybdenum, tungsten, an alloy containing molybdenum and tungsten, an alloy containing molybdenum and zirconium, or molybdenum nitride be formed as each of the first and third layers, and that a film formed of a low-resistance material such as copper, aluminum, gold, silver, or an alloy containing copper and manganese be formed as the second layer. Note that a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used.

Note that the conductive film may be formed using the above-described method for controlling the resistivity of an oxide semiconductor.

<<Adhesive Layer>>

For the adhesive layer 265, a curable resin such as a heat curable resin, a photocurable resin, or a two-component type curable resin can be used. For example, a resin including acrylic ester, a urethane bond, an epoxy group, or a siloxane bond or the like can be used.

<<Connector>>

As the connector, an anisotropic conductive film (ACF), an anisotropic conductive paste (ACP), or the like can be used, for example.

<<Light-Blocking Film>>

The light-blocking film is provided between adjacent coloring films. As the light-blocking film, for example, a black matrix may be formed using a metal material or a resin material containing pigment or dye. Note that it is preferable to provide the light-blocking film also in a region other than the display portion, such as a driver circuit portion, in which case undesired leakage of guided light or the like can be inhibited.

This embodiment can be implemented in appropriate combinations with any of the other embodiments.

Embodiment 4

In this embodiment, an oxide semiconductor is described with reference to FIGS. 21A to 21E, FIGS. 22A to 22E, FIGS. 23A to 23D, FIGS. 24A and 24B, and FIG. 25.

<Structure of Oxide Semiconductor>

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that includes a void. Because of its instability, an a-like OS has physical properties similar to those of an amorphous oxide semiconductor.

<CAAC-OS>

First, the details of the CAAC-OS are described.

The CAAC-OS is one of oxide semiconductors having a plurality of c-axis-aligned crystal parts (also referred to as pellets).

Analysis of a CAAC-OS by X-ray diffraction (XRD) will be described. For example, when the structure of a CAAC-OS including an InGaZnO$_4$ crystal, which is classified into the space group R-3m, is analyzed by an out-of-plane method, a peak appears at a diffraction angle (2θ) of around 31° as shown in FIG. 21A. This peak is derived from the (009) plane of the InGaZnO$_4$ crystal, which indicates that crystals in the CAAC-OS have c-axis alignment, and that the c-axes are aligned in a direction substantially perpendicular to a surface over which a CAAC-OS film is formed (also referred to as a formation surface) or the top surface of the CAAC-OS film. Note that another peak may appear when 2θ is around 36°, in addition to the peak at 2θ of around 31°. The peak at 2θ of around 36° is attributed to a crystal structure classified into the space group Fd-3m; thus, this peak is preferably not exhibited in the CAAC-OS.

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the InGaZnO$_4$ crystal. When analysis (φ scan) is performed with 2θ fixed at around 56° while the sample is rotated around a normal vector to the sample surface as an axis (φ axis), as shown in FIG. 21B, a peak is not clearly observed. In contrast, in the case where single crystal InGaZnO$_4$ is subjected to φ scan with 2θ fixed at around 56°, as shown in FIG. 21C, six peaks which are derived from crystal planes equivalent to the (110) plane are observed. Accordingly, the structural analysis using XRD shows that the directions of the a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 21D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 21E shows a diffraction pattern obtained in such a manner that an electron beam with a probe diameter of 300 nm is incident on the same sample in a direction perpendicular to the sample surface. As shown in FIG. 21E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 21E is considered to be derived from the (010) plane, the (100) plane, and the like of the InGaZnO$_4$ crystal. The second ring in FIG. 21E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 22A:
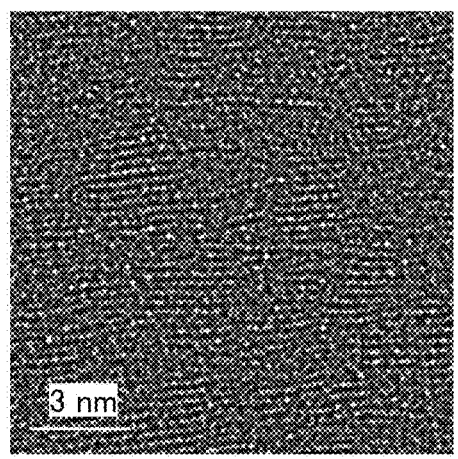
FIGS. 22A to 22E show a cross-sectional TEM image and plan-view TEM images of a CAAC-OS and images obtained through analysis thereof.

FIG. 22A shows a high-resolution TEM image of a cross section of the CAAC-OS which is observed in a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

FIG. 22A shows pellets in which metal atoms are arranged in a layered manner. FIG. 22A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 22B:
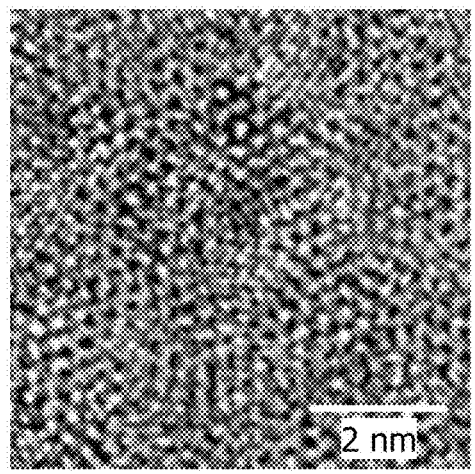
Figure 22C:
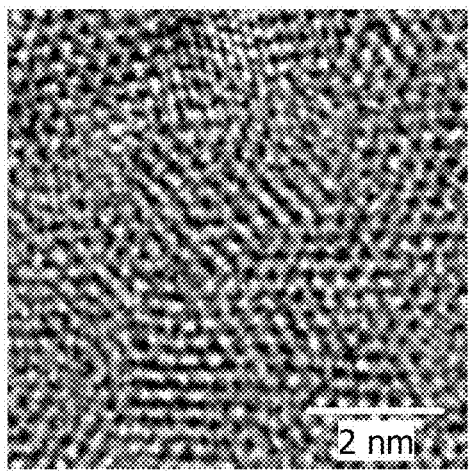
Figure 22D:
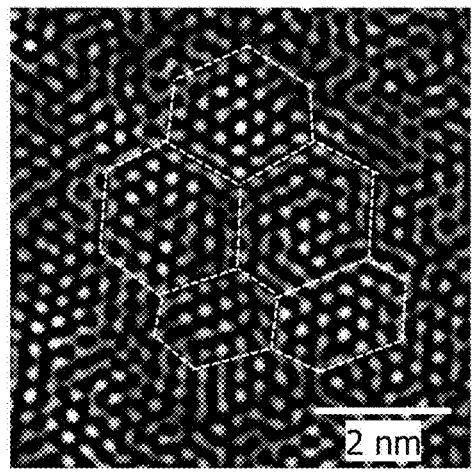
Figure 22E:
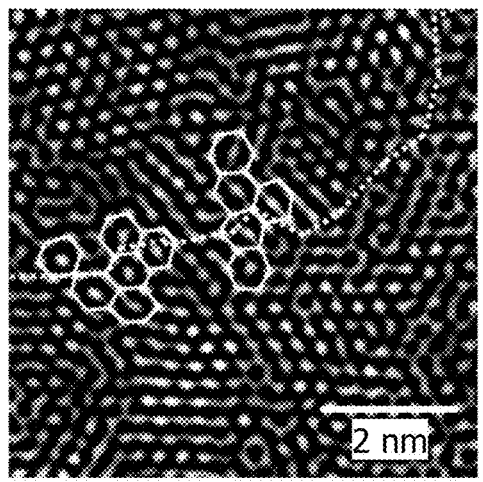

FIGS. 22B and 22C show Cs-corrected high-resolution TEM images of a plane of the CAAC-OS observed in the direction substantially perpendicular to the sample surface. FIGS. 22D and 22E are images obtained by image processing of FIGS. 22B and 22C. The method of image processing is as follows. The image in FIG. 22B is subjected to fast Fourier transform (FFT) to obtain an FFT image. Then, mask processing is performed on the obtained FFT image such that part in the range from 2.8 nm$^{-1}$ to 5.0 nm$^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 22D, a portion in which the lattice arrangement is broken is shown by dashed lines. A region surrounded by dashed lines corresponds to one pellet. The portion shown by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 22E, a dotted line denotes a portion between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, a distorted pentagon, and/or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, a change in interatomic bond distance by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 23A:
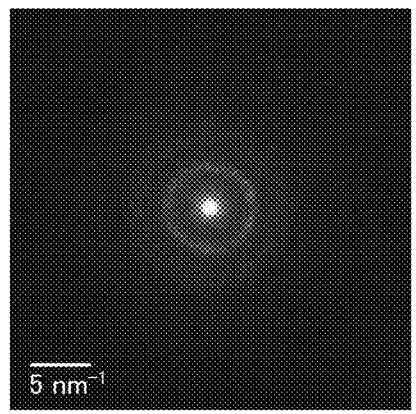
FIGS. 23A to 23D show electron diffraction patterns and a cross-sectional TEM image of an nc-OS.
Figure 23B:
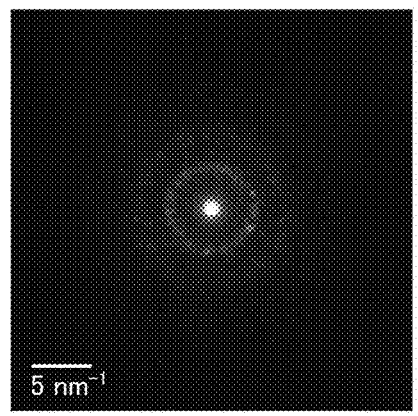

For example, when an electron beam with a probe diameter of 50 nm is incident on a 34-nm-thick region of a thinned nc-OS including an $InGaZnO_4$ crystal in the direction parallel to the formation surface, a ring-like diffraction pattern (nanobeam electron diffraction pattern) shown in FIG. 23A is observed. FIG. 23B shows a diffraction pattern (nanobeam electron diffraction pattern) obtained when an electron beam with a probe diameter of 1 nm is incident on the same sample. In FIG. 23B, a plurality of spots are observed in a ring-like region. Thus, ordering in an nc-OS is not observed with an electron beam with a probe diameter of 50 nm but is observed with an electron beam with a probe diameter of 1 nm.

Figure 23C:
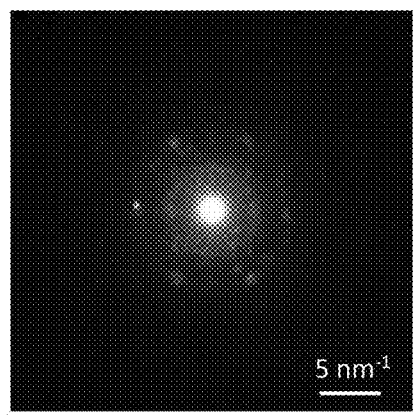

When an electron beam with a probe diameter of 1 nm is incident on a region with a thickness less than 10 nm, an electron diffraction pattern in which spots are arranged in an approximately regular hexagonal shape as shown in FIG. 23C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 23D:
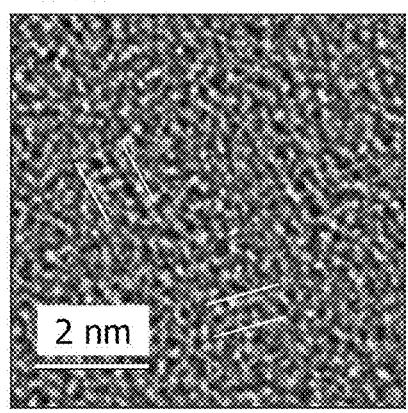

FIG. 23D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<a-like OS>

The a-like OS has a structure intermediate between those of the nc-OS and the amorphous oxide semiconductor.

Figure 24A:
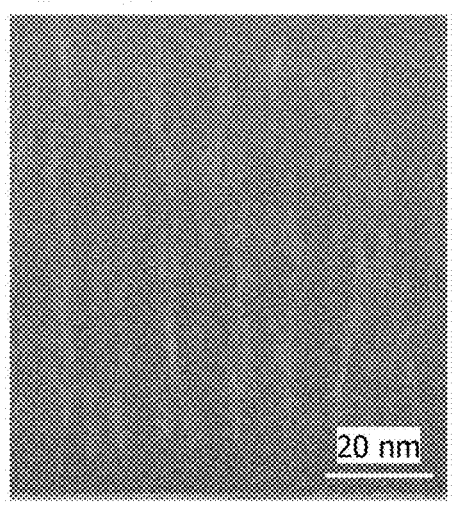
FIGS. 24A and 24B show cross-sectional TEM images of an a-like OS.
Figure 24B:
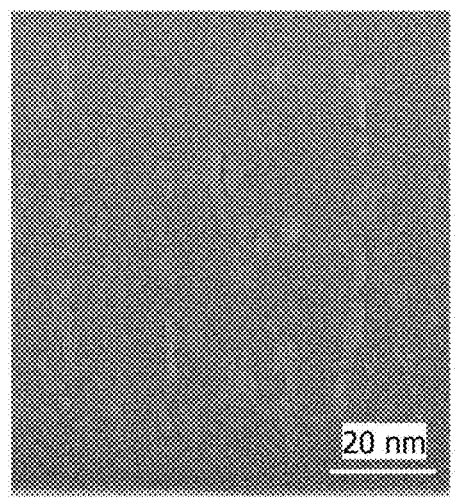

FIGS. 24A and 24B show high-resolution cross-sectional TEM images of the a-like OS. FIG. 24A is the high-resolution cross-sectional TEM image of the a-like OS taken at the start of the electron irradiation. FIG. 24B is the high-resolution cross-sectional TEM image of the a-like OS taken after the irradiation with electrons ($e^-$) at $4.3 \times 10^8$ $e^-/nm^2$. FIGS. 24A and 24B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it includes a void. To verify that the a-like OS has an unstable structure as compared with the CAAC-OS and the nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of $InGaZnO_4$ in the following description. Each lattice fringe corresponds to the a-b plane of the $InGaZnO_4$ crystal.

Figure 25:
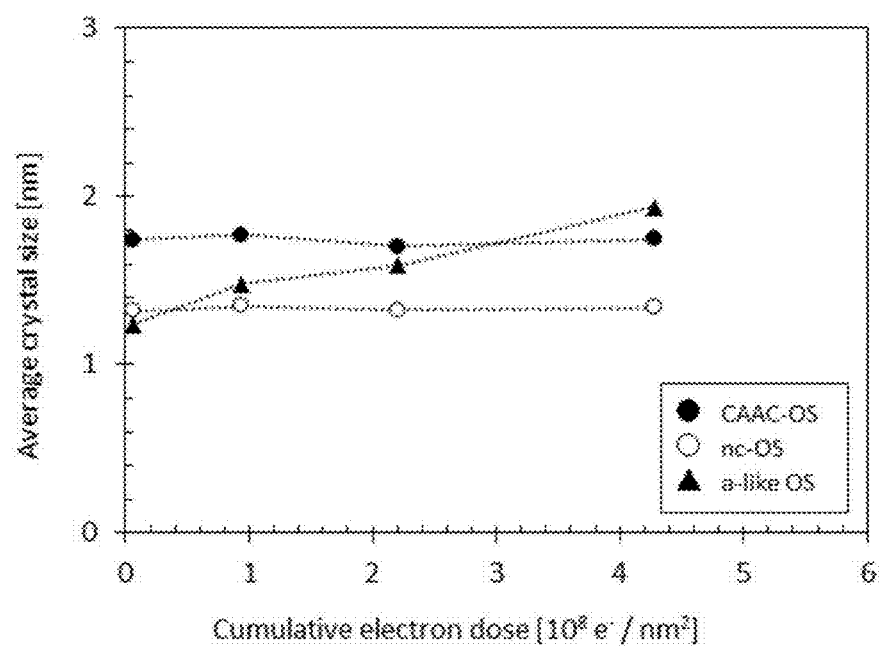
FIG. 25 illustrates one embodiment of the present invention.

FIG. 25 shows changes in the average size of crystal parts (at 22 points to 30 points) in each sample. Note that the crystal part size corresponds to the length of a lattice fringe. FIG. 25 indicates that the crystal part size in the a-like OS increases with an increase in the cumulative electron dose in obtaining TEM images, for example. As shown in FIG. 25, a crystal part with a size of approximately 1.2 nm (also referred to as an initial nucleus) at the start of TEM observation grows to a size of approximately 1.9 nm at a cumulative electron (e−) dose of $4.2 \times 10^8$ e−/nm². In contrast, the crystal part sizes in the nc-OS and the CAAC-OS show little change from the start of electron irradiation to a cumulative electron dose of $4.2 \times 10^8$ e−/nm². As shown in FIG. 25, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ e−/(nm²·s); and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density lower than 78% of the density of the single crystal oxide semiconductor.

For example, in the case of an oxide semiconductor whose atomic ratio of In to Ga and Zn is 1:1:1, the density of single crystal InGaZnO₄ with a rhombohedral crystal structure is 6.357 g/cm³. Accordingly, in the case of the oxide semiconductor whose atomic ratio of In to Ga and Zn is 1:1:1, the density of the a-like OS is higher than or equal to 5.0 g/cm³ and lower than 5.9 g/cm³, for example. In the case of the oxide semiconductor whose atomic ratio of In to Ga and Zn is 1:1:1, the density of the nc-OS and the density of the CAAC-OS are each higher than or equal to 5.9 g/cm³ and lower than 6.3 g/cm³, for example.

In the case where an oxide semiconductor having a certain composition does not exist in a single crystal state, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition may be calculated using a weighted average with respect to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_O$H). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm⁻³, preferably lower than $1 \times 10^{11}$ cm⁻³, and further preferably lower than $1 \times 10^{10}$ cm⁻³ and is higher than or equal to $1 \times 10^{-9}$ cm⁻³.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm⁻³ and lower than $1 \times 10^{18}$ cm⁻³, further preferably higher than or equal to $1 \times 10^7$ cm⁻³ and lower than or equal to $1 \times 10^{17}$ cm⁻³, still further preferably higher than or equal to $1 \times 10^9$ cm⁻³ and lower than or equal to $5 \times 10^{16}$ cm⁻³, yet further preferably higher than or equal to $1 \times 10^{10}$ cm⁻³ and lower than or equal to $1 \times 10^{16}$ cm⁻³, and yet still preferably higher than or equal to $1 \times 10^{11}$ cm⁻³ and lower than or equal to $1 \times 10^{15}$ cm⁻³.

This embodiment can be implemented in appropriate combinations with any of the other embodiments.

Embodiment 5

In this embodiment, specific examples of electronic devices each of which is manufactured using the liquid crystal display device described in any of the above embodiments are described with reference to FIGS. 26A and 26B, FIGS. 27A to 27D, and FIG. 28.

Examples of electronic devices to which the present invention can be applied include electronic paper, a portable information terminal, and the like. A specific example of such an electronic device is illustrated in FIGS. 26A and 26B.

Figure 26A:
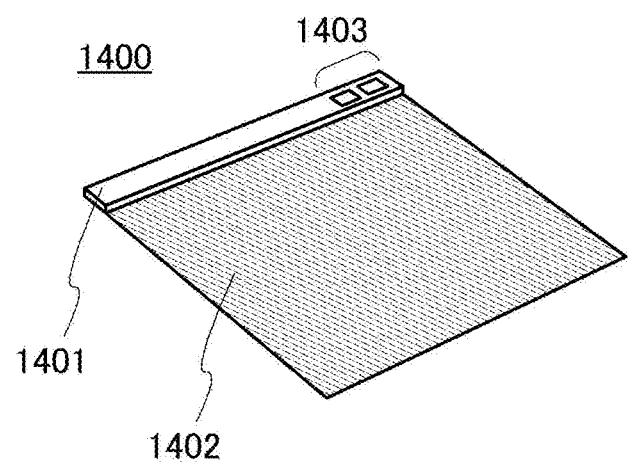
FIGS. 26A and 26B illustrate an electronic device of one embodiment of the present invention.

FIG. 26A illustrates electronic paper 1400. The electronic paper 1400 includes a display portion 1402, a control portion 1401 above the display portion 1402, and operation buttons 1403 in the control portion 1401. The liquid crystal display device of one embodiment of the present invention can be used for the display portion 1402.

Figure 26B:
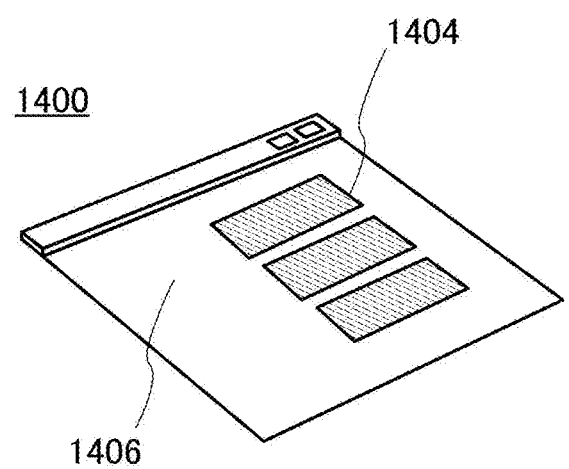

FIG. 26B illustrates an example of display performed by the electronic paper 1400; a region 1404 is a writable portion and a region 1406 is a non-writable portion.

FIGS. 27A to 27D illustrate another example of electronic paper, in which the display device of one embodiment of the present invention is applied to a sticky note used as a temporary note or mark on a document, a book, or the like.

FIGS. 27A to 27D illustrate a display device 800, a display portion 802, a terminal portion 804, an adhesive portion 806, a terminal 808, a book 810, and a reader/writer 812.

Figure 27A:
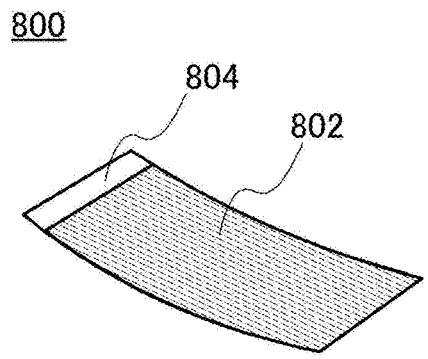
FIGS. 27A to 27D illustrate an electronic device of one embodiment of the present invention.
Figure 27B:
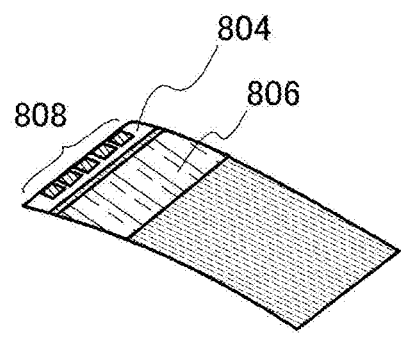
Figure 27C:
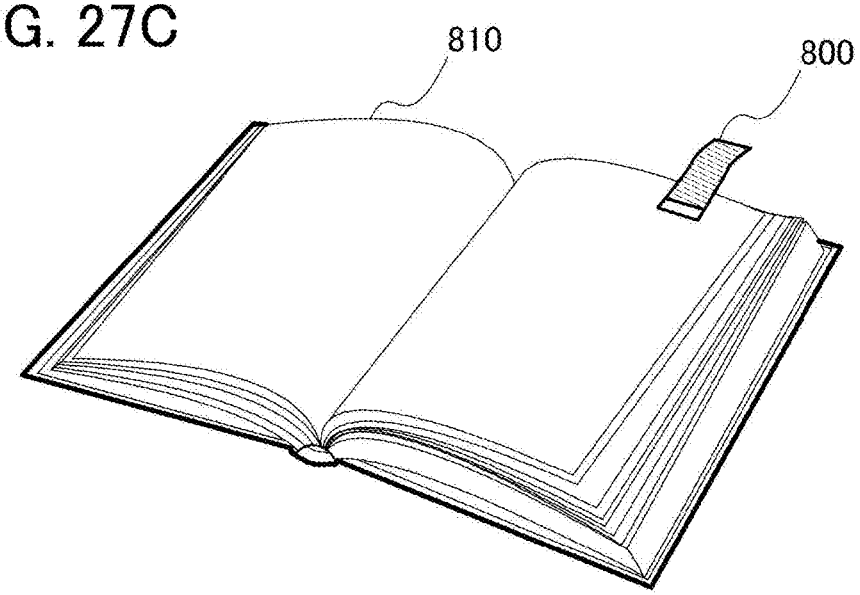

FIG. 27A is a schematic view of the display device 800 seen from a side on which the display portion 802 is formed, and the terminal portion 804 is provided at one end of the display portion 802. FIG. 27B is a schematic view showing a side opposite to the side on which the display portion 802 is formed; the adhesive portion 806 is provided and the terminal portion 804 includes the terminal 808. FIG. 27C illustrates an example in which the display device 800 is attached to the book 810 as a sticky note.

An adhesive material which enables the display device 800 to be temporarily bonded and fixed to a document, a book, or the like is used for the adhesive portion 806. The display device 800 is used as a sticky note and therefore needs to be detachable at any time when necessary. Thus, a material or a structure whose adhesion is adjusted so that an object to which the display device 800 is attached, such as a document or a book, is not damaged by detachment of the display device 800 is desirably used for the adhesive portion 806. In view of this, an acrylic resin, for example, can be used for the adhesive portion 806. Furthermore, the area of the adhesive portion 806 in contact with an object can be decreased to adjust the adhesion thereof by roughening the surface of the adhesive portion 806 made of an acrylic resin or by applying a plurality of particles of an acrylic resin to the adhesive portion 806.

The terminal 808 of the terminal portion 804 contains a conductive material for electrical connection to a reading means and a writing means so that data written in the display portion 802 can be read and an image can be displayed in the display portion 802. Although FIG. 27B illustrates an example where the number of terminals is five, the number and position of terminals may be set as appropriate depending on a reading method and an image display method.

Figure 27D:
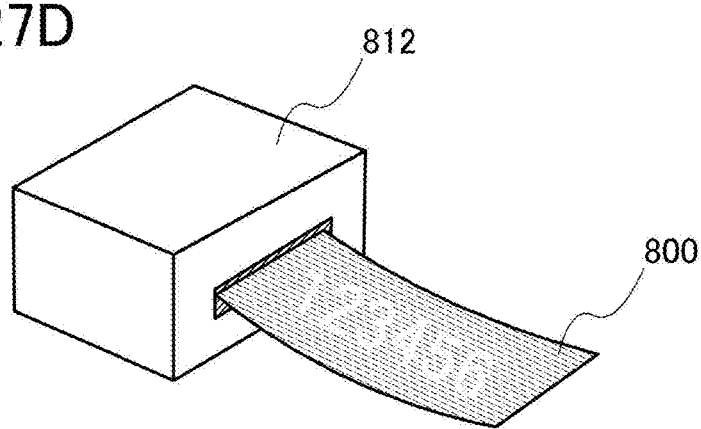

FIG. 27D illustrates a state in which the terminal portion 804 of the display device 800 is connected to the reader/writer 812 which can perform both reading of data written to the display device 800 and writing of image data to the display device 800.

Figure 28:
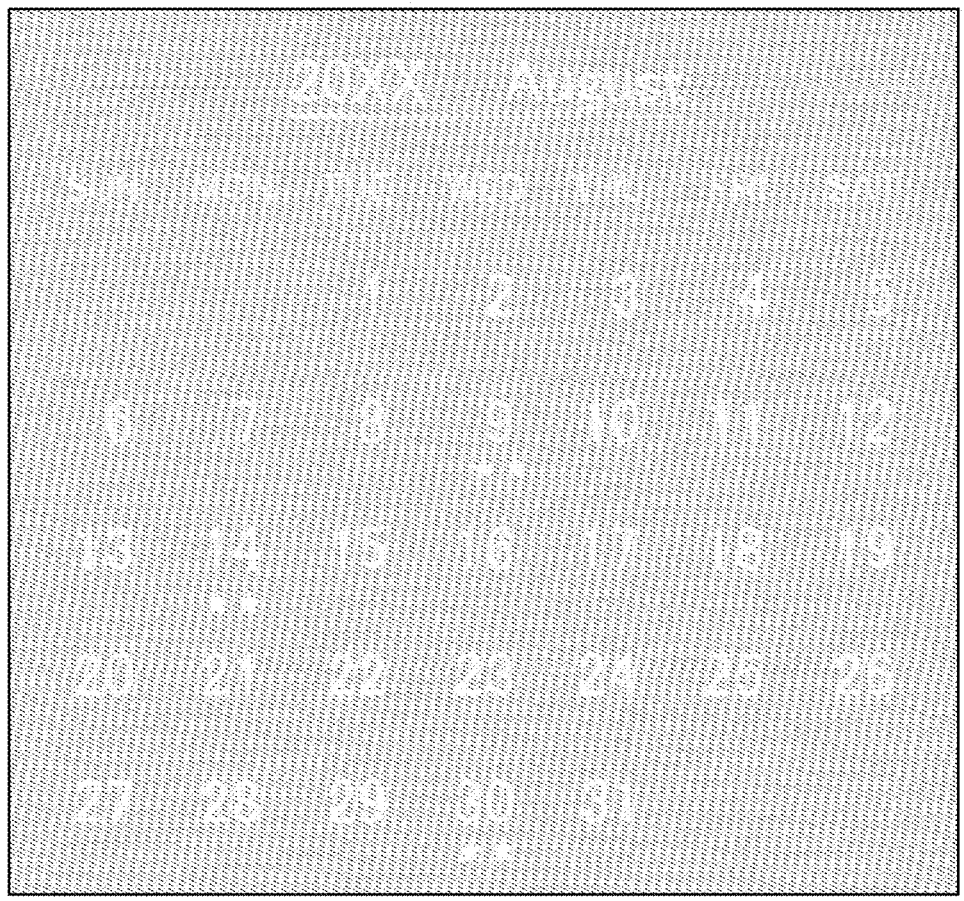
FIG. 28 illustrates an electronic device of one embodiment of the present invention.

FIG. 28 illustrates an example in which the display device 800 of one embodiment of the present invention is applied to a calendar.

A monthly calendar is generally used in such a manner that the days of the week and the dates of the month from the beginning to the end of the month are fixedly displayed and a note on an appointment or the like is written in a blank space. The display device of one embodiment of the present invention can be operated in the above manner as illustrated in FIG. 28, that is, the days of the week and the dates of the month are fixedly displayed and writing can be performed in a blank space. In addition, the written content can be stored in a storage medium by using the reader/writer 812.

This embodiment can be implemented in appropriate combinations with any of the other embodiments.

(Supplementary Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment and/or a content (or part thereof) described in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In each embodiment, one embodiment of the present invention has been described; however, one embodiment of the present invention is not limited to the described embodiment. The example in which a channel formation region of a transistor such as the transistor 203_a includes polysilicon or an oxide semiconductor is described in Embodiment 2 as one embodiment of the present invention; however, one embodiment of the present invention is not limited thereto. Depending on circumstances or conditions, various semiconductors may be included in various transistors, a channel formation region of a transistor, a source region or a drain region of a transistor, or the like of one embodiment of the present invention. For example, at least one of silicon, germanium, silicon germanium, silicon carbide, gallium arsenide, aluminum gallium arsenide, indium phosphide, gallium nitride, an organic semiconductor, and the like may be included.

<Notes on the Description for Drawings>

In this specification and the like, terms for describing arrangement, such as "over" and "under," are used for convenience for describing the positional relation between components with reference to drawings. The positional relation between components is changed as appropriate in accordance with a direction in which the components are described. Thus, terms for describing arrangement are not limited to those used in this specification and can be changed to other terms as appropriate depending on the situation.

The term "over" or "under" does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent of each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

<Notes on Expressions that can be Rephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" or "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film," "layer," and the like can be interchanged with each other depending on the case or circumstances. For example, the term "conductive layer" can be changed into the term "conductive film" in some cases. Also, the term "insulating film" can be changed into the term "insulating layer" in some cases.

This specification and the like show a 1T-1C circuit configuration where one pixel has one transistor and one capacitor; however, one embodiment of the present invention is not limited to this example. It is possible to employ a circuit configuration where one pixel has two or more transistors and two or more capacitors. Moreover, a variety of circuit configurations can be obtained by formation of an additional wiring.

<Notes on Definitions of Terms>

The following are definitions of the terms not mentioned in the above embodiments.

[Switch]

In this specification and the like, a switch is in a conductive state (on state) or in a non-conductive state (off state) to determine whether current flows therethrough or not. Alternatively, a switch has a function of selecting and changing a current path.

Examples of the switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

[Channel Length]

In this specification and the like, the channel length refers to, for example, in a top view of a transistor, the distance between a source and a drain in a region where a semiconductor (or a portion of the semiconductor in which current flows when the transistor is in the on state) and a gate overlap with each other or in a region where a channel is formed.

The channel length of a transistor is not necessarily constant in all regions. In other words, the channel length of a transistor is not limited to one value in some cases. Therefore, in this specification, the channel length is any one value, the maximum value, the minimum value, or the average value in a region where a channel is formed.

[Channel Width]

In this specification and the like, the channel width refers to, for example, the length of a portion where a source and a drain face each other in a region where a semiconductor (or a portion of the semiconductor in which current flows when a transistor is in the on state) and a gate electrode overlap with each other or in a region where a channel is formed.

The channel width of a transistor is not necessarily constant in all regions. In other words, the channel width of a transistor is not limited to one value in some cases. Therefore, in this specification, the channel width is any one value, the maximum value, the minimum value, or the average value in a region where a channel is formed.

Depending on the transistor structure, the channel width in a region where a channel is actually formed (hereinafter referred to as an effective channel width) is different from the channel width shown in a top view of the transistor (hereinafter referred to as an apparent channel width) in some cases. For example, in a transistor having a three-dimensional structure, the effective channel width is larger than the apparent channel width shown in a top view of the transistor, and an influence of the effective channel width cannot be ignored in some cases. For example, in a miniaturized transistor having a three-dimensional structure, the proportion of a channel region formed on a side surface of a semiconductor is high in some cases. In this case, the effective channel width obtained when a channel is actually formed is larger than the apparent channel width shown in a top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

[Pixel]

In this specification and the like, one pixel refers to one element whose brightness can be controlled, for example. Therefore, for example, one pixel corresponds to one color element by which brightness is expressed. Accordingly, in a color display device using color elements of red (R), green (G), and blue (B), the smallest unit of an image is formed of three pixels of an R pixel, a G pixel, and a B pixel.

Note that the number of colors for color elements is not limited to three, and more colors may be used. For example, RGBW (W: white) or RGB added with yellow, cyan, or magenta may be employed.

[Display Element]

In this specification and the like, a display element such as the light-emitting element 104 includes a display medium whose contrast, luminance, reflectance, transmittance, or the like is changed by electrical or magnetic effect. Examples of display elements include an electroluminescent (EL) element, an LED chip (e.g., a white LED chip, a red LED chip, a green LED chip, or a blue LED chip), a transistor (a transistor that emits light depending on current), an electron emitter, a display element including a carbon nanotube, a liquid crystal element, electronic ink, an electrowetting element, an electrophoretic element, a plasma display panel (PDP), a display element using micro electro mechanical systems (MEMS) (such as a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), a carbon nanotube, a quantum dot, and the like. Examples of display devices including an EL element include an EL display. Examples of display devices including an electron emitter include a field emission display (FED), an SED-type flat panel display (SED: surface-conduction electron-emitter display), and the like. Examples of display devices including a liquid crystal element include a liquid crystal display (e.g., a transmissive liquid crystal display, a transflective liquid crystal display, a reflective liquid crystal display, a direct-view liquid crystal display, or a projection liquid crystal display). Examples of display devices including electronic ink, an Electronic Liquid Powder (registered trademark), or an electrophoretic element include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including micro electro mechanical systems (MEMS), a drying agent may be provided in a space where the display element is sealed (or between an element substrate over which the display element is placed and a counter substrate opposed to the element substrate, for example). Providing a drying agent can prevent MEMS and the like from becoming difficult to move or deteriorating easily because of moisture or the like.

[Connection]

In this specification and the like, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

This application is based on Japanese Patent Application serial no. 2015-210120 filed with Japan Patent Office on Oct. 26, 2015, the entire contents of which are hereby incorporated by reference.

What is claimed is:

1. A display device comprising a pixel comprising:
   a first transistor;
   a second transistor;
   a third transistor;
   a first capacitor;
   a liquid crystal element;
   a first wiring; and
   a second wiring arranged parallel to the first wiring,
   wherein a first terminal of the first transistor is electrically connected to the first wiring,
   wherein a second terminal of the first transistor is electrically connected to a first terminal of the third transistor and to a first terminal of the liquid crystal element,
   wherein a second terminal of the third transistor is electrically connected to a first terminal of the first capacitor,
   wherein a gate of the third transistor is electrically connected to a first terminal of the second transistor, and
   wherein a second terminal of the second transistor is electrically connected to the second wiring.

2. The display device according to claim 1, further comprising a third wiring and a fourth wiring,
   wherein a gate of the first transistor is electrically connected to the third wiring which intersects with the first wiring, and
   wherein a gate of the second transistor is electrically connected to the fourth wiring which is arranged parallel to the third wiring.

3. The display device according to claim 1,
   wherein a first voltage is configured to be applied to a second terminal of the liquid crystal element, and
   wherein a second voltage is configured to be applied to a second terminal of the first capacitor.

4. The display device according to claim 1, further comprising a second capacitor, wherein a first terminal of the second capacitor is electrically connected to the first terminal of the second transistor.

5. The display device according to claim 4,
   wherein a first voltage is configured to be applied to a second terminal of the liquid crystal element, and
   wherein a second voltage is configured to be applied to a second terminal of the first capacitor and to a second terminal of the second capacitor.

6. The display device according to claim 1, wherein the liquid crystal element comprises a cholesteric liquid crystal.

7. A display device comprising a pixel comprising:
   a first transistor;
   a second transistor;
   a third transistor;
   a first capacitor;
   a liquid crystal element;
   a first wiring; and
   a second wiring arranged parallel to the first wiring, wherein a first terminal of the first transistor is electrically connected to the first wiring, wherein a second terminal of the first transistor is electrically connected to a first terminal of the third transistor and to a first terminal of the liquid crystal element, wherein a second terminal of the third transistor is electrically connected to a first terminal of the first capacitor, wherein a gate of the third transistor is electrically connected to a first terminal of the second transistor, wherein a second terminal of the second transistor is electrically connected to the second wiring, wherein an image signal is configured to be applied to the liquid crystal element from the first wiring through the first transistor, and wherein a potential supplied to the second wiring is set high or low to determine whether to make the pixel rewritable or non-rewritable.

8. The display device according to claim 7, further comprising a third wiring and a fourth wiring, wherein a gate of the first transistor is electrically connected to the third wiring which intersects with the first wiring, and wherein a gate of the second transistor is electrically connected to the fourth wiring which is arranged parallel to the third wiring.

9. The display device according to claim 7, wherein a first voltage is configured to be applied to a second terminal of the liquid crystal element, and wherein a second voltage is configured to be applied to a second terminal of the first capacitor.

10. The display device according to claim 7, further comprising a second capacitor, wherein a first terminal of the second capacitor is electrically connected to the first terminal of the second transistor.

11. The display device according to claim 10, wherein a first voltage is configured to be applied to a second terminal of the liquid crystal element, and wherein a second voltage is configured to be applied to a second terminal of the first capacitor and to a second terminal of the second capacitor.

12. The display device according to claim 7, wherein the liquid crystal element comprises a cholesteric liquid crystal.

* * * * *